(12) United States Patent
Hollmer et al.

(10) Patent No.: US 9,721,658 B1
(45) Date of Patent: Aug. 1, 2017

(54) MEMORY DEVICES AND METHODS FOR STORING SINGLE DATA VALUE IN MULTIPLE PROGRAMMABLE RESISTANCE ELEMENTS

(71) Applicants: Shane Charles Hollmer, Grass Valley, CA (US); Nad Edward Gilbert, Gilbert, AZ (US)

(72) Inventors: Shane Charles Hollmer, Grass Valley, CA (US); Nad Edward Gilbert, Gilbert, AZ (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/791,416

(22) Filed: Jul. 4, 2015

Related U.S. Application Data

(63) Continuation of application No. 13/408,367, filed on Feb. 29, 2012, now Pat. No. 9,099,175.

(60) Provisional application No. 61/448,006, filed on Mar. 1, 2011.

(51) Int. Cl.
*G11C 11/00* (2006.01)
*G11C 13/00* (2006.01)

(52) U.S. Cl.
CPC ........ *G11C 13/004* (2013.01); *G11C 13/0069* (2013.01)

(58) Field of Classification Search
USPC .......................... 365/148, 158, 171, 173, 163
See application file for complete search history.

(56) References Cited

U.S. PATENT DOCUMENTS

| | | | | |
|---|---|---|---|---|
| 2007/0133269 A1* | 6/2007 | Lee | ...................... | G11C 11/5678 365/163 |
| 2008/0310244 A1* | 12/2008 | Baker | ...................... | G11C 7/02 365/207 |
| 2011/0235391 A1* | 9/2011 | Kim | ......................... | G11C 8/10 365/148 |

OTHER PUBLICATIONS

U.S. Appl. No. 13/408,367, filed Feb. 29, 2015, parent of the present application.

* cited by examiner

*Primary Examiner* — Han Yang

(57) ABSTRACT

A memory device can include a plurality of bit lines; plurality of memory elements coupled to the bit lines, each memory element including a memory layer formed between two electrodes, the memory layer being programmable between a plurality of different resistance states by creation and removal of conductive regions therein by application of electric fields; and at least one sense amplifier (SA) configured to compare a first value, corresponding to a resistance state of a first memory element, to a second value, corresponding to a resistance state of a second memory element.

14 Claims, 20 Drawing Sheets

MEMORY DEVICES AND METHODS FOR STORING SINGLE DATA VALUE IN MULTIPLE PROGRAMMABLE RESISTANCE ELEMENTS

This application is a continuation of U.S. patent application Ser. No. 13/408,367, filed on Feb. 29, 2012, which claims the benefit of U.S. Provisional Patent Application Ser. No. 61/448,006 filed on Mar. 1, 2011, the contents all of which are incorporated by reference herein.

TECHNICAL FIELD

The present disclosure relates generally to memory devices, and more particularly to memory devices with storage elements that exhibit a change in property when data are read from the storage elements.

BACKGROUND

Memory devices typically include memory elements for storing data. "Flash" electrically erasable and programmable read only memories (EEPROMs) can include an electrical storage gate layer for altering a transistor threshold voltage. Thus, such devices may sense data values based on a transistor threshold voltage.

Devices having one time programmable elements, such as "anti-fuse" elements, can program an element by creating a non-reversible conductive path. Thus, such devices may sense data values based on a static resistance of the cell.

Conventional conductive bridge random access memories (CBRAMs) may include memory elements (sometimes referred to as programmable metallization cells (PMCs)) that may be programmed (or erased) to different resistance levels. Many PMC cells may have a metal-insulator-metal (MIM) structure. In one state (e.g., erased), substantially no current may flow through the MIM structure. In another state (e.g., programmed), a conductive path may be formed through the insulator layer. Accordingly, such memory devices may sense data values based on a resistance of a storage element (e.g., PMC).

In all of these conventional examples, it is intended that the sense operation measure a property of the memory cell that remains substantially unchanged over the duration of the operation. Other operations, typically called "write" and "erase," are employed to change the value of the property that is to be sensed. Likewise, it is intended that the property to be sensed also remain substantially unchanged in between operations. Changes that do occur may be considered "errors," and additional "correction" operations may be employed to return the property of the cell to its intended value. In contrast, during a write or erase operation, the property to be sensed will change with time, and no data value may be assigned to the cell.

DETAILED DESCRIPTION OF THE EMBODIMENTS

Below embodiments show methods, devices, and circuits for operating on memory elements that store data based on a timed change in a property of a memory element. Unlike conventional approaches that may determine stored data values based on a static characteristic of a memory cell (e.g., threshold voltage, resistance), embodiments may sense a data value by determining the length of time required to cause a property of a memory element to change. Accordingly, in contrast to static property memories, like those noted above, a definite, one-to-one relationship may exist between the data value of the cell and the time required to cause a property of the cell to change. However, no definite relationship needs to exist between the data value of the cell and the value of the property itself or the value of the change in the property.

In some embodiments, a memory cell may include a metal-insulator-metal (MIM) type element, and the property of the cell that is to be changed may be the existence or nonexistence of an electrically conductive filament between the two (metal) electrodes. In some embodiments, an electrical voltage may be used to bring the filament into or out of existence. In one embodiment, an electrical conductance of the element may differ depending on whether or not (or to what extent) a filament exists, and an electrical circuit may use this change in conductance to measure the time required to bring the filament into or out of existence. However, other embodiments may involve different properties of an element, different techniques for changing those properties, and different techniques for measuring the time required to do so. That is, embodiments may store values based on the time required to change a property other than conductance In some embodiments, memory device may include two terminal storage elements that may be written (e.g., programmed) between two or more different states. However, unlike other memory types, each state corresponds to a dynamic response, rather than a static value. In particular, under the same sense bias conditions, an element having one state may undergo a change in property within a time period, while an element in another state may not undergo such a change in conductance within the same time period. In very particular embodiments, such memory elements can be two terminal elements having an ion conducting layer formed between two electrodes.

In some embodiments, a change in property may involve a change from one resistance to a lower resistance. However, in other embodiments, elements may change from a lower resistance to a higher resistance, or dynamic changes in capacitance may occur.

Elements may be programmed between different states multiple times. That is, such elements may not be one time programmable.

Figure 1:
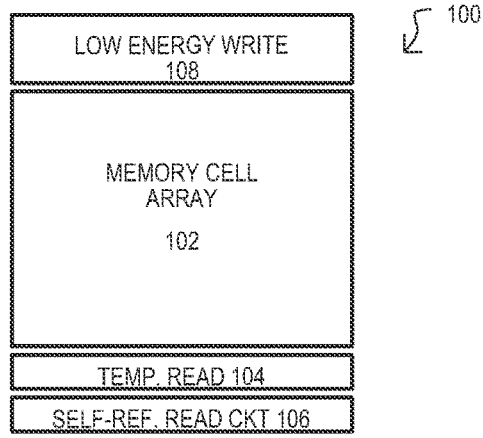
FIG. 1 is a block schematic diagram of a memory device according to an embodiment.

FIG. 1 shows a memory device 100 according to an embodiment. A memory device can form all or part an integrated circuit, or be realized by a number of integrated circuit devices. A memory device 100 can include a memory cell array 102 that includes memory elements programmable into two or more states, where each different state corresponds to a different time-to-change in property under the same sense conditions. It is understood that such differences in a time-to-change can include an element in one state changing its properties in a typical read (e.g., sense) operation, while an element in another state can have properties that remain substantially unchanged during in a read operation. However in other embodiments, elements in different states can change at different times in a read operation (e.g., elements in one state can undergo a change in property faster than elements in another state).

A memory cell array 102 can include elements having direct electrical connections to lines (e.g., bit lines, row lines). In addition, a memory cell array 102 can include memory elements connected to bit lines by access devices.

Referring still to FIG. 1, a memory device 100 can further include any of: a temperature dependent read section 104, self-reference read section 106, or a low energy write section 108. It is understood that embodiments can include one of these sections, less than all of these sections, or all of these sections.

More detailed descriptions of implementations of such sections, as well as methods related to such sections will be described below.

Temperature Variable Read Operations and Circuits

Figure 2:
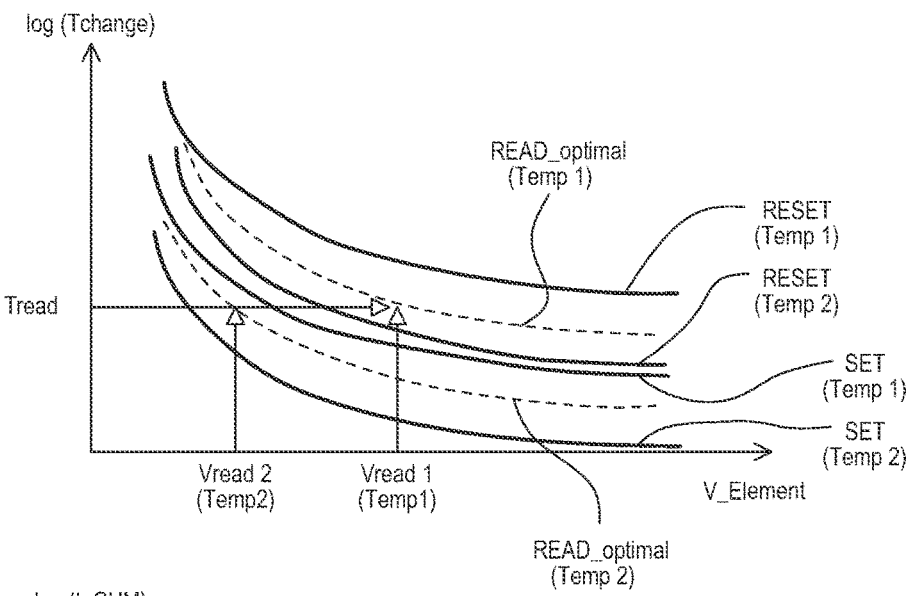
FIG. 2 is a graph showing temperature responses of memory elements according to an embodiment.

FIG. 2 is a graph showing a temperature response of memory elements according to one particular embodiment. The vertical axis shows a time that is required for sense conditions to induce a change in property in an element. The horizontal axis shows a voltage (bias conditions) applied to a memory element. FIG. 2 also includes waveforms showing responses over a range of temperatures (from Temp 1 to Temp 2). Waveforms RESET(Temp1) and RESET(Temp2) show a response of an element having one state (called the RESET state herein). Waveforms SET(Temp1) and RESET(Temp2) show similar responses for a second state (called the SET state herein). As shown, a SET state has a shorter time to change than a RESET state.

FIG. 2 also shows a waveform Read_optimal(Temp1) which shows a read time/voltage at temperature Temp1 (i.e., points between RESET(Temp1) and SET(Temp1). Similarly, waveform Read_optimal(Temp2) shows a read time/voltage at temperature Temp2 (i.e., points between RESET(Temp2) and SET(Temp2).

FIG. 2 shows a read voltage Vread1. As shown, under Vread1 conditions and at temperature Temp1, a read time Tread is sufficient to distinguish between a RESET and SET state. That is, a SET element will change properties by time Tread, while a RESET element will not change properties. However, as shown in the figure, at temperature Temp2, a read time Tread under conditions Vread1 is not suitable, as both SET and RESET elements can change properties within the time Tread.

As understood from the graph, at a temperature (Temp 2) a different voltage (Vread2) is suitable to achieve a same response (change in SET element, but not RESET element within time Tread).

Embodiments of the invention can compensate read conditions (e.g., Vread and/or Tread) based on a temperature, to help ensure that different time-to-change states can be distinguished with a read operation. In particular embodiments, a read time and/or voltage can decrease as temperature increases. However, alternate embodiments, utilizing memory elements with different responses, read times can increase as temperatures increases.

Figure 3:
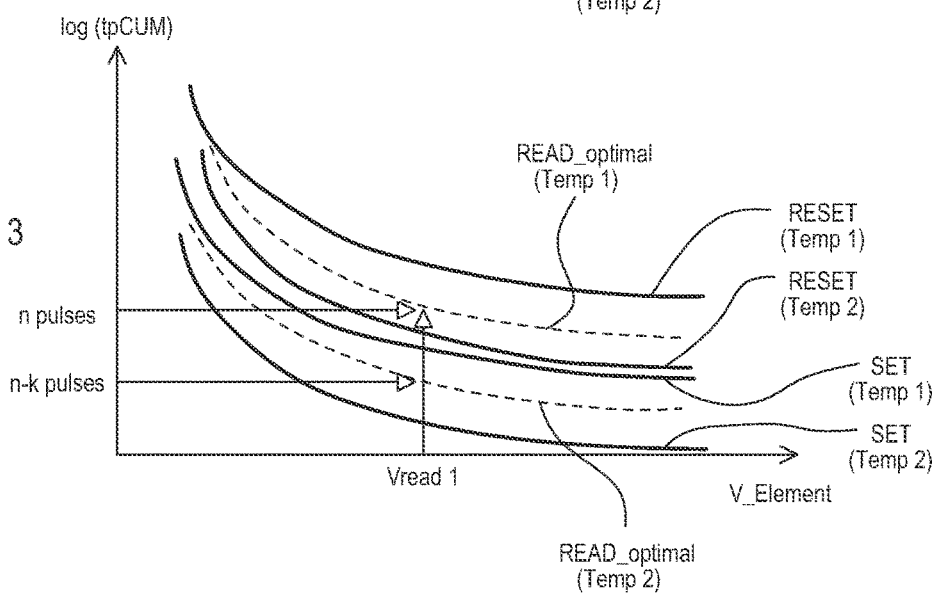
FIG. 3 is a graph showing temperature responses of memory elements according to another embodiment.

FIG. 3 is a graph showing another example of a temperature response of memory elements according to an embodiment. A horizontal axis of FIG. 3 can be the same as FIG. 2. However, a vertical axis shows a duration of a read voltage applied (in this case, in numbers of pulses). Element responses shown are substantially the same as FIG. 2.

FIG. 3 shows a read voltage Vread1. As shown, under Vread1 conditions and at temperature Temp1, a duration of n pulses is sufficient to distinguish between a RESET and SET state. However, at temperature Temp2, a smaller duration (n-k pulses) is suitable to distinguish between SET and RESET states.

Embodiments of the invention can compensate read conditions (e.g., number of read pulses) based on a temperature, to help ensure that different time-to-change states can be distinguished with a read operation. In particular embodiments, a number of read pulses can decrease as temperature increases. However, as noted for FIG. 2, in alternate embodiment utilizing memory elements with different responses, read pulses can increase as temperatures increases.

FIGS. 2 and 3 show how embodiments can vary a read voltage, a read duration, or both to arrive at suitable read conditions for a given temperature.

Figure 4:
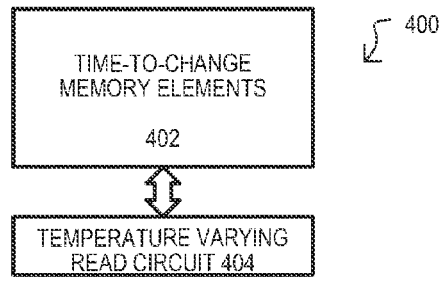
FIG. 4 is a block schematic diagram of a memory device with temperature varying read circuits according to an embodiment.

FIG. 4 is a block schematic diagram showing a memory device 400 according to an embodiment. A memory device 400 can include time-to-change memory elements 402 and a temperature varying read circuit 404. Time-to-change memory elements 402 can be programmed to different states, where each different state corresponds to a different time to change in property under the same sense conditions.

Temperature varying read circuits 404 can apply sense conditions to memory elements 402 that can cause elements in a certain state to change properties within a certain time frame. The applied sense conditions can vary according to a temperature value. In some embodiments, a temperature varying read circuit 404 can maintain a same sense time, but vary other conditions. For example, in a particular embodiment, a voltage and/or current can be varied in response to temperature, while a read time remains the same. Thus, sense conditions can be applied to induce a change in property (according to a stored data value) within substantially the same time period over various operating temperatures of the device 400.

Alternatively, electrical conditions (e.g., applied voltage) can remain substantially the same, while a sensing time periods varies with temperature.

It is understood that a temperature can be sensed by the device 400, or can be received from a source external to the device 400.

In some embodiments, sense conditions can be electrical conditions that vary with temperature, such electrical conditions including but not limited to: a bias voltage across memory elements, a current flowing through memory elements, or combinations thereof. Sense conditions can also include a duration of electrical conditions, including pulse durations and/or pulse number, as but a two examples.

In this way, a memory device can include a read circuit that varies read conditions of time-to-change elements with temperature.

Figure 5:
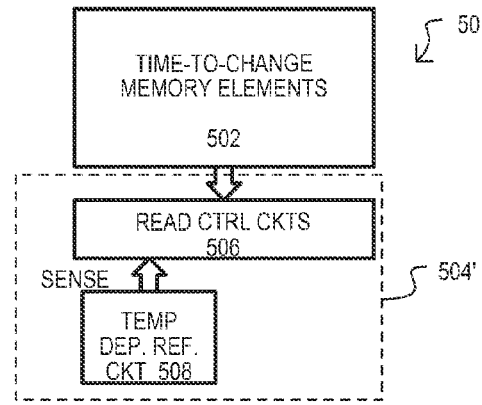
FIG. 5 is a block schematic diagram of a memory device with temperature varying read circuits according to another embodiment.

FIG. 5 is a block schematic diagram showing a memory device 501 having items like those of FIG. 4, and like items are shown with the same reference characters, but with the first digit being "5".

FIG. 5 shows a temperature dependent read circuit 504' that includes read control circuits 506 and a temperature dependent reference circuit 508. Read control circuits 506 can sense data values stored in memory elements 502 by applying one or more sense conditions (SENSE) to the elements 502, and detecting any property changes within a predetermined time. SENSE conditions can be received from temperature dependent reference circuit 508.

Temperature dependent reference circuit 508 can generate values (SENSE) for output to read control circuits 506. Temperature dependent reference circuit 508 can monitor a temperature of memory device 501 and generate SENSE values in response to a sensed temperature. In particular embodiments, temperature dependent reference circuit 508 can sense a temperature with proportional to absolute temperature (PTAT) circuit elements, complementary to absolute temperature (CTAT) circuit elements, or combinations thereof. Any suitable temperature sensing circuit can be used.

In this way, read conditions of time-to-change elements in a device can be varied with temperature sensing circuits incorporated within the device.

Figure 6:
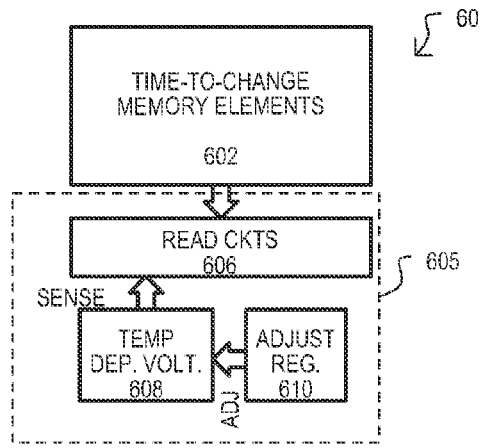
FIG. 6 is a block schematic diagram of a memory device with temperature varying read circuits according to a further embodiment.

FIG. 6 is a block diagram showing a memory device 603 having items like those of FIG. 5, and like items are shown with the same reference characters, but with the first digit being "6".

FIG. 6 shows a temperature dependent read circuit 605 that includes read control circuits 606, a temperature dependent reference circuit 608, and an adjustment circuit 610.

An adjustment circuit 610 can provide adjustment values ADJ that can result in temperature dependent reference circuit 608 modifying SENSE values in response to data in addition to a sensed temperature.

In particular embodiments, adjustment values ADJ can include device dependent values, including but not limited to any of: wear data (e.g., cycles, wear leveling operations, etc.), manufacturing data (e.g., manufacturing lot characterization data), and operating condition data (e.g., operating temperature limits).

In this way, temperature dependent read conditions for time-to-change elements can be modified by device dependent data.

Figure 7:
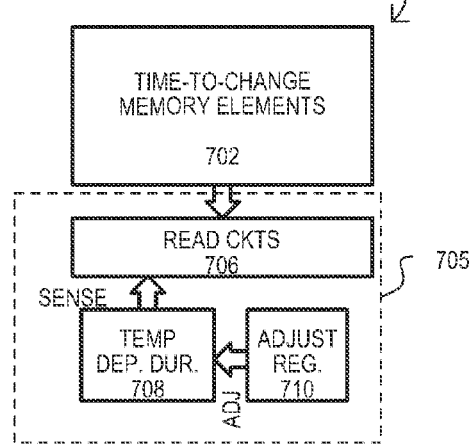
FIG. 7 is a block schematic diagram of a memory device with temperature varying read circuits according to another embodiment.

FIG. 7 is a block diagram showing a memory device 703 having items like those of FIG. 5, and like items are shown with the same reference characters, but with the first digit being "7".

FIG. 7 varies from that of FIG. 5 in that it includes a temperature dependent duration circuit 708.

Temperature dependent duration circuit 708 can generate values (SENSE) for output to read control circuits 706. Values (SENSE) can vary the duration of sense conditions applied to memory elements 702.

Figure 8:
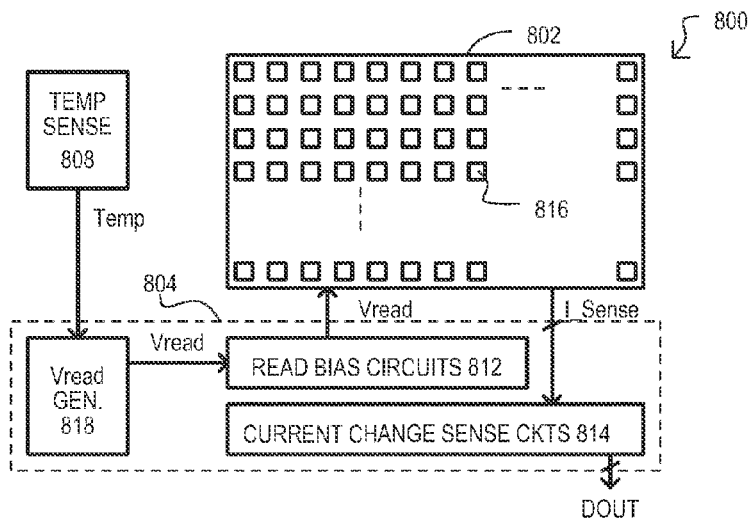
FIG. 8 is a block schematic diagram of a memory device with temperature varying read circuits according to another embodiment.

FIG. 8 is a block schematic diagram shows a memory device 800 according to an embodiment having a memory array 802, a temperature dependent read circuit 804, and a temperature sense circuit 808.

A memory array 802 can include memory cells (one shown as 816) arranged into rows and columns, each memory cell having one or more memory elements that store data with a time-to-change property, as described herein, or equivalents. As will be shown in more detail below, memory cells 816 can be formed by a memory element having a direct connection to an access line (e.g., bit line), or by memory cells having one or more access devices that connect a memory element to an access line.

A temperature sense circuit 808 can provide a temperature value Temp in response to a sensed temperature. In particular embodiments, a temperature sense circuit 808 can sense a temperature according to suitable methods, including PTAT and CTAT elements, as noted for embodiments above.

A temperature dependent read circuit 804 can include a read bias voltage generator 818, read bias circuit 812, and current change sense circuits 814. Read bias voltage generator 818 can generate a bias voltage Vread in response to a temperature value Temp. That is, Vread can vary in response to a sensed temperature.

Read bias circuits 812 apply a bias voltage Vread to memory array 802 in a read operation. Application of Vread to memory array 802 can result in a bias voltage being applied across selected memory cells 806 that can induce a change in property of elements within the cell within a set period of time (provided such cells store a particular data value). In some embodiments, in a read (e.g., sense) operation, a read bias circuit 812 can apply a read bias by controlling voltages applied to opposing terminals of memory elements within the memory cells. However, in other embodiments, a read bias circuit 812 can apply a read bias by controlling a voltage applied to one terminal of memory elements, with other terminals of the memory elements being maintained at some substantially constant voltage. Read bias circuits 812 can also vary a duration of read bias conditions in response to temperature value Temp.

Current change sense circuits 814 can sense changes in current flowing through memory cells biased by a Vread voltage. Thus, in the embodiment of FIG. 8, a change in memory element property results in a change in current flow through the corresponding memory element. Current change sense circuit 814 can sense such changes to determine a data value stored within a memory cell. In a very particular embodiment, current change sense circuit 814 can output one data value for a memory cell if the application of Vread results in a change in current within a sense time, and another value is no such change in current is detected within the sense time.

In some embodiments, a bias voltage Vread can be generated that varies to maintain a substantially constant sense time over a wide range of operating temperature. In other embodiments, durations of applied read conditions can be varied, and a bias voltage can be substantially constant. In still other embodiments, both bias and duration can be varied in response to temperature.

In this way, temperature dependent read circuits can generate bias conditions that vary according to temperature, and sense changes in current flowing through memory elements.

Figure 9:
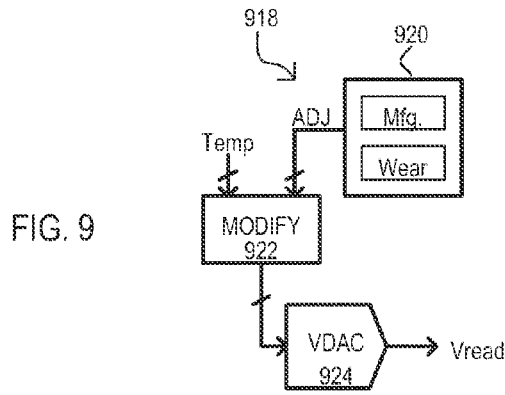
FIG. 9 is a block schematic diagram of a read voltage generator that can be included in embodiments.

FIG. 9 is a block schematic diagram showing an example of a read bias voltage generator 918 that can be included in embodiments, and can be one particular implementation of that shown as 818 in FIG. 8. Read bias voltage generator 918 can receive an adjustment value ADJ corresponding to a condition or state of a memory device, other than temperature, that can impact a sense time of memory elements.

FIG. 9 shows adjustment data ADJ being generated in response to manufacturing data (Mfg.) and/or wear data (Wear). Data Mfg. can identify device features that can vary a sense (e.g., read) response, including but not limited to: how a device was manufactured, materials utilized within the device, etc. Wear data can identify device operation features that can vary a read response, including but not limited to: the number of write operations performed on a device, or device region (e.g., sector), or other some other subdivision of a memory elements.

A modifying circuit 922 can generate a digital value in response to value ADJ and a temperature value Temp. Such a digital value can be applied to a voltage digital-to-analog converter (VDAC) to generate a desired read voltage Vread.

FIGS. 10A to 10D are block schematic diagrams showing examples of memory arrays. Such memory arrays, or equivalents, can be included in embodiments shown herein.

Figure 10A:
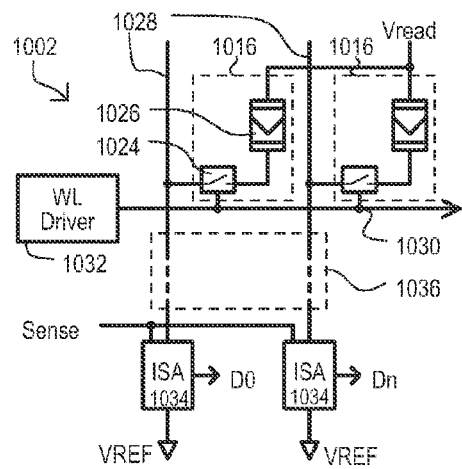
FIGS. 10A to 10D are block schematic diagrams of memory arrays that can be included in embodiments.

FIG. 10A shows a memory array 1002 having memory cells (two shown as 1016), bit lines 1028, word lines (one shown as 1030), word line driver (one shown as 1032), sense amplifiers (two shown as 1034), and optionally, a decoded path 1036.

Each memory cell 1016 can include an access device (one shown as 1024) and memory element (one shown as 1026). Memory elements 1026 can be two terminal devices. In particular embodiments, memory elements 1026 can include a solid-state ion conductor material disposed between electrodes. Access devices 1024 can connect one terminal of memory elements 1024 to bit lines 1028 when enabled by a voltage on a corresponding word line 1030. In a read operation, the other terminals of memory elements 1016 can be connected to a read bias voltage Vread. It is understood that according to embodiments, Vread can vary with temperature.

Word line driver 1032 can drive a corresponding word line 1030 between selection and de-selection voltages in response to selection data, such as address data. Even more particularly, a word line 1030 can be driven in response to row address data for a memory array 1002.

Sense amplifiers 1034 can be controlled by a signal Sense to sense a current flowing on bit lines 1028. Signal Sense can be active for a limited period of time (Tsense). Thus, if a memory element 1026 changes to a lower conductance while under a read bias voltage during time Tsense, a sense amplifier 1034 can sense such a change, and output one data value. In contrast, if a memory element 1026 does not significantly change in conductance while under a read bias voltage during time Tsense, a sense amplifier 1034 can output a different data value. Sense amplifiers 1034 can generate voltage on bit lines 1028 that can create a read bias across memory cells 1016 selected in a corresponding read operation.

Optional decoded path 1036 can selectively connect any of multiple bit lines 1028 to sense amplifiers 1034 in response to selection data, such as address data, even more particularly, column address data for a memory array 1002.

Figure 10B:
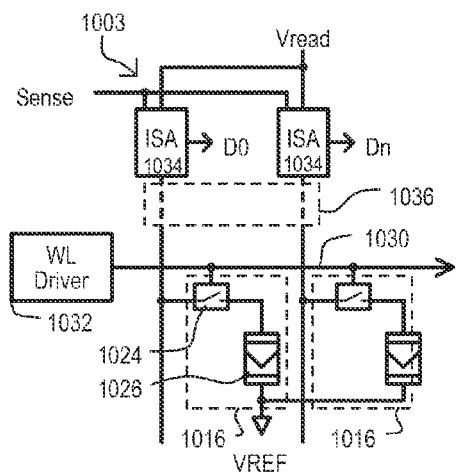

FIG. 10B shows a memory array 1003 like that of FIG. 10A, and like items are referred to with the same reference character. FIG. 10B shows how a temperature dependent read voltage Vread can be applied by, or through, sense amplifiers 1034.

In this way, a memory device with temperature dependent read conditions for memory elements that store data according to a time-to-change in property can include arrays with memory cells having access devices to memory elements.

Figure 10C:
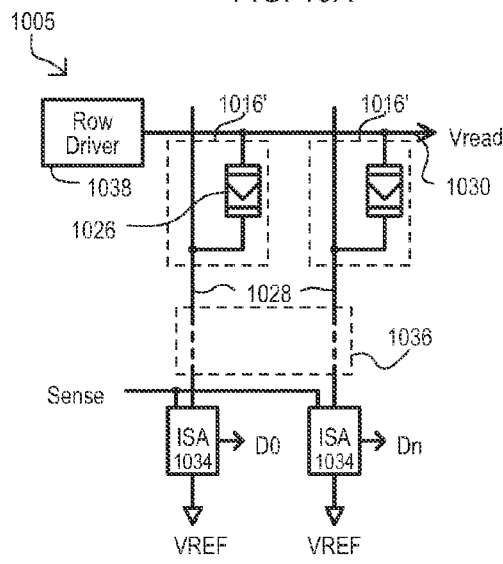

FIG. 10C shows a memory array 1005 like that of FIG. 10A, and like items are referred to with the same reference character. FIG. 10C differs from FIG. 10A in that memory cells 1016' do not include an access device, and include memory elements (one shown as 1026) with one terminal directly connected to a corresponding bit line 1028 and a second terminal connected to a row line 1030.

Further, unlike FIG. 10A, in FIG. 10C a row driver circuit 1038 can drive a word line 1030 with a temperature dependent read voltage Vread. Such an arrangement can create a "cross point" type array.

Figure 10D:
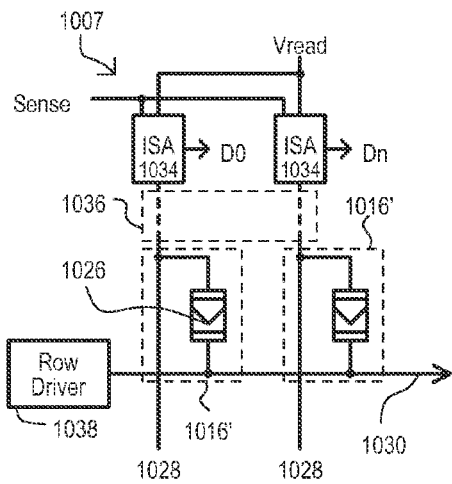

FIG. 10D shows a memory array 1007 like that of FIG. 10C, and like items are referred to with the same reference character. FIG. 10D shows how a temperature dependent read voltage Vread can be applied by, or through, sense amplifiers 1034.

In this way, a memory device with temperature dependent read conditions for memory elements that store data according to a time-to-change in property can include cross point type arrays of memory elements.

Figure 11A:
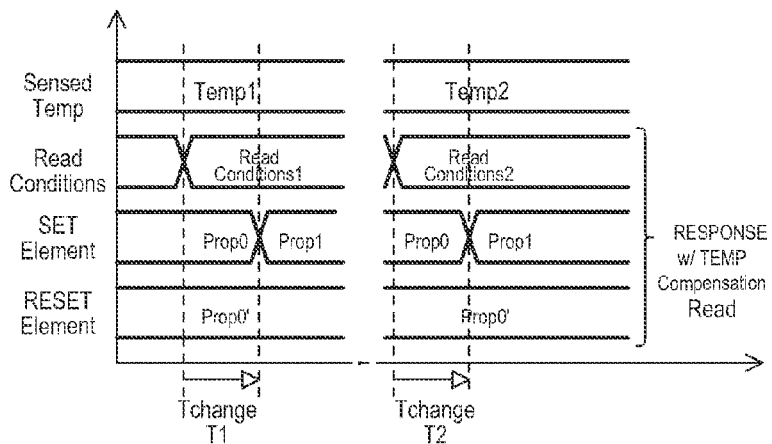
FIGS. 11A and 11B are graphs showing temperature compensated read operations according to embodiments.
Figure 11B:
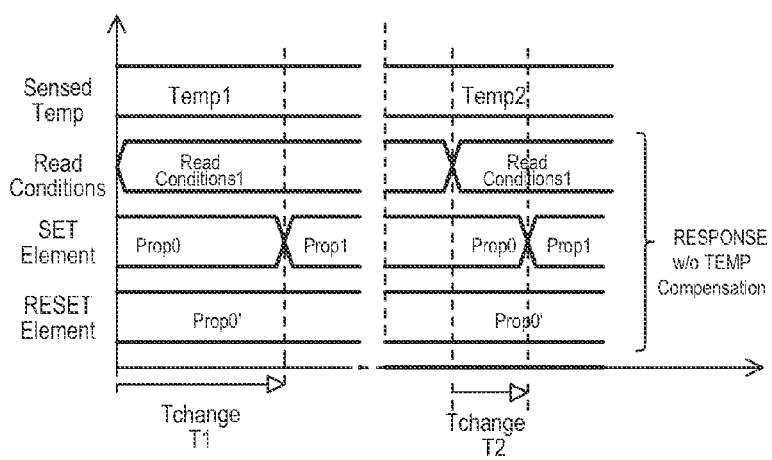

FIGS. 11A and 11B are graphs showing temperature compensated read operations according to one embodiment. Both graphs show a sensed temperature (Sensed Temp), applied sense conditions (Read Conditions), a response of an element programmed to one state (SET Element), and a response of an element programmed to another state (RESET Element).

FIG. 11A shows the generation of Read Conditions1 corresponding to a sensed temperature Temp1. Under such conditions, a memory element programmed to the SET state can change properties from an initial property Prop0 to a different property Prop1, after a time Tchange T1. In contrast, a memory element programmed to the RESET state does not substantially change properties, maintaining an initial property Prop0'.

FIG. 11A then shows the generation of Read Conditions2 corresponding to a sensed temperature Temp2. Under such conditions, memory elements programmed to the SET and RESET states can yield substantially the same response (i.e., Tchange T1≅Tchange T2). Such a result can enable a memory device to maintain consistent device responses despite the fact that element responses can change with temperature.

FIG. 11B shows the same operations as FIG. 11A, but without temperature compensation. Thus, in the second read operation at temperature Temp2, read conditions continue to be Read Conditions1. As a result, SET and RESET states yield substantially different responses (i.e., Tchange T1>>Tchange T2).

It is noted that in some embodiments, an increase in temperature can result in an increase in time to change for elements (i.e., Temp1>Temp2 in FIGS. 11A and 11B). However, in other embodiments, an increase in temperature can result in a decrease in time to change for elements (i.e., Temp1<Temp2 in FIGS. 11A and 11B).

Figure 12:
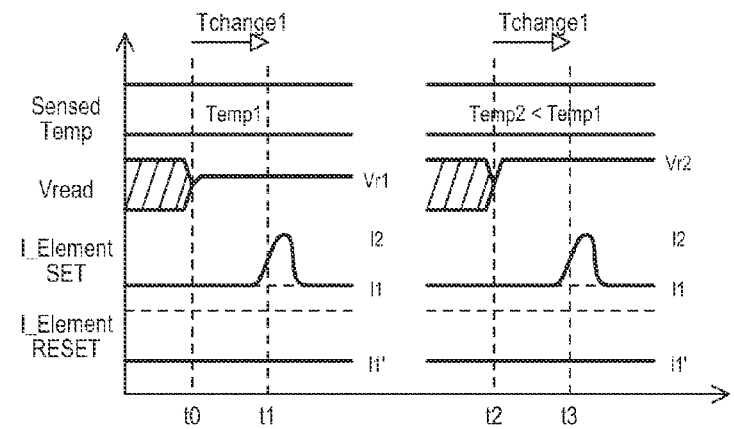
FIG. 12 is a graph showing a temperature compensated read operation according to another embodiment.

FIG. 12 is a graph representing a temperature compensated read operation according to another embodiment. In one embodiment, FIG. 12 can be one particular implementation of that shown in FIG. 11A. FIG. 12 shows a sensed temperature (Sensed Temp), a read bias voltage Vread, a current sensed for an element programmed to one state (I_Element SET), and a current sensed for an element programmed to another state (I_Element RESET).

FIG. 12 shows a read operation in which a bias voltage Vread is varied with temperature. In particular, Vread is increased as temperature decreases.

At time t0, a first read operation at temperature Temp1 can begin with a Vread voltage of Vr1 being applied to memory elements to determine data values stored therein.

At time t1, I_Element SET dynamically increases, indicating the SET state. I_Element RESET remains substantially the same, indicating the RESET state.

At time t2, a second read operation at a lower temperature Temp2 can begin. Due to the decrease in temperature, a Vread voltage can be increased to Vr2, which is higher than Vr1.

At time t3, I_Element SET dynamically increases in substantially the same amount of time (Tchange1), to indicate the SET state. I_Element RESET remains substantially the same, indicating the RESET state.

FIG. 12 shows an arrangement in which a sensed current can be dynamically stopped. That is, once an increase in current is sensed, a bias voltage can be removed, or a sensed memory element can be disconnected, thus a sensed current can return to a low/no current level.

Figure 13A:
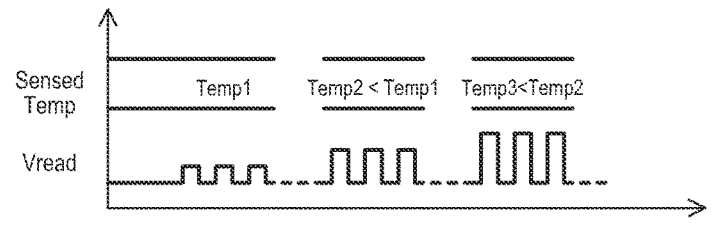
FIGS. 13A and 13B are graphs showing the generation of read bias values according to embodiments.
Figure 13B:
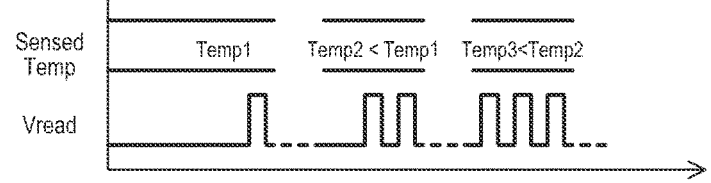

FIGS. 13A and 13B are graphs show the generation of Vread biasing values according to additional embodiments. Both graphs include a waveform Sensed Temp which shows three different sensed temperatures, where Temp1>Temp 2>Temp 3. A waveform Vread is also shown, which represents a value applied to a memory element in a sense operation.

FIG. 13A shows how a magnitude of the electrical conditions can be varied in response to temperature. More particularly, a read voltage magnitude can be varied according to temperature. FIG. 13B shows how a duration of electrical conditions can be varied in response to temperature. More particularly, a number of voltage pulses can be varied in response to temperature.

It is understood that other embodiments can combine such two approaches, varying magnitude in combination with duration to arrive at substantially constant read times over a wide operating temperature range.

Figure 14:
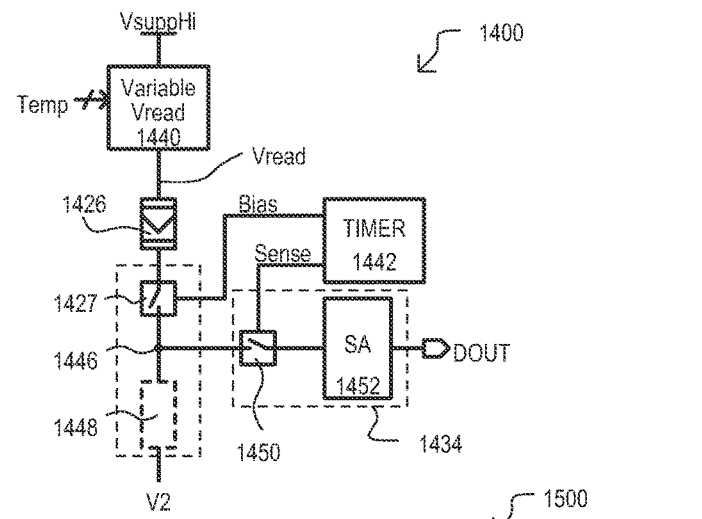
FIG. 14 is a block schematic diagram of a memory device according to another embodiment.

FIG. 14 is a block schematic diagram showing a memory device 1400 according to another embodiment. A memory device 1400 can include a memory element 1426, a sense section 1434, a temperature variable bias section 1440, and a timer circuit 1442.

A memory element 1426 can be programmable to either undergo, or not undergo, a change in property within a time T_change under sense bias conditions, as described herein or equivalents.

A temperature variable bias section 1440 can apply sense bias conditions to a memory element 1426 in response to timer circuit 1442. In particular, sense bias conditions can be applied for a time T_Change. A bias switch 1427, and optionally a load circuit 1448, can be arranged in series with memory element 1426. When bias switch 1427 is enabled (e.g., conducting), bias conditions can be applied across memory element 1426. A load circuit 1448 can be a passive load or an active load.

A sense section 1434 can determine whether or not a change in property has occurred within a memory element 1426. In particular, after bias conditions have been applied to memory element 1426 for time T_Change, a sense section 1434 can check for a change in property. In the very particular embodiment of FIG. 14, a sense section 1434 can include a sense switch 1450 and a sensing circuit 1452. When sense switch 1450 is enabled, a sensing circuit 1452 can determine if a change in property has occurred in a sensed element from a voltage at, and/or a current flowing through, a sense node 1446, as such a voltage/current can vary as properties of memory element 1426 dynamically change.

A timer circuit 1442 can provide signals for enabling switches 1427 and 1450. In the embodiment shown, a timer circuit 1444 can activate signal Bias for a time T_Change, to apply bias conditions to memory element 1426. Subsequently, signal Sense can be activated to sense any change in property in the memory element 1426.

In this way, a memory device can include bias circuits that apply sense bias conditions and sense circuits that sense any property changes arising from the bias conditions.

Figure 15:
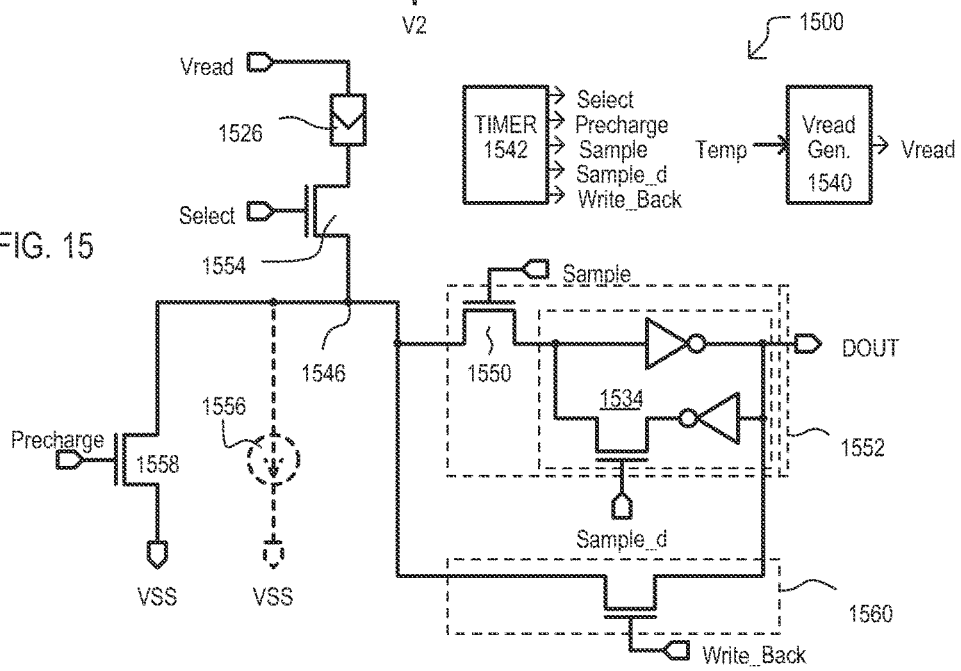
FIG. 15 is a block schematic diagram of a memory device according to a further embodiment.

FIG. 15 is a block schematic diagram showing a memory device 1500 according to a further embodiment. A memory device 1500 can include items like those in FIG. 14, and such like items are referred to by the same reference character but with the first digits being "15".

Memory device 1500 can include a precharge switch 1558 and a select switch 1554. A precharge switch 1558 can precharge a sense node 1546 to a potential (in this case VSS) in response to a precharge signal (Precharge). A select switch 1554 can connect a memory element 1526 to a sense node 1546 in response to a select signal (Select). When precharge switch 1558 and select switch 1554 are enabled, read bias conditions (e.g., Vread-VSS) can be applied across memory element 1526.

In an alternate embodiment, a current source circuit 1556 can be included in place of precharge switch 1558. In such an arrangement, when select switch 1554 is enabled, bias conditions can be applied across memory element 1526 that vary according to current source circuit 1556. A current source circuit 1556 can be operated to provide a desired bias level to sense node 1546.

In memory device 1500, a sense section 1552 can include a sense switch 1550 and sense circuit 1534, which in this embodiment can be a latch. Sense switch 1550 can be enabled by a signal Sample, and latching of the latch can be enabled by a signal Sample_d.

Optionally, a memory device 1510 further includes a write back circuit 1560. Following a data sensing operation, in response to a write back signal (Write_Back) a write back circuit 1560 can apply a voltage across memory element 1526 that can reinforce and/or reestablish its initial state.

A timer circuit 1542 can generate signals Select, Precharge, Sample, Sample_d, and optionally signal Write_Back. A voltage generator circuit 1540 can generate a temperature varying read voltage Vread, as described in the embodiments herein, or equivalents.

The above descriptions have shown structure and corresponding methods. Particular methods according to embodiments will now be described in series of flow diagrams.

Figure 16:
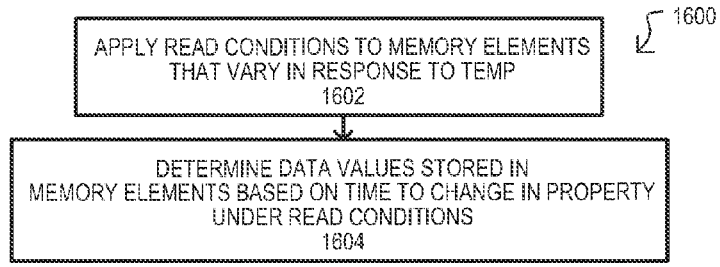
FIG. 16 is a flow diagram showing a temperature compensated read operation according to an embodiment.

FIG. 16 is a flow diagram showing a method 1600 according to an embodiment. Method 1600 includes applying read conditions that vary according to temperature (1602). Read conditions can be those conditions applied to memory elements that enable data to be read from such memory elements. In some embodiments, read conditions include electrical conditions applied to memory elements. In very particular embodiments, read conditions can be a bias voltage applied across the memory elements.

Data values stored by memory elements can then be determined based on a time-to-change in property under the read conditions (1604). Method 1600 thus includes varying reading conditions according to temperature, where such read conditions detect a dynamic change in a memory element property.

Figure 17:
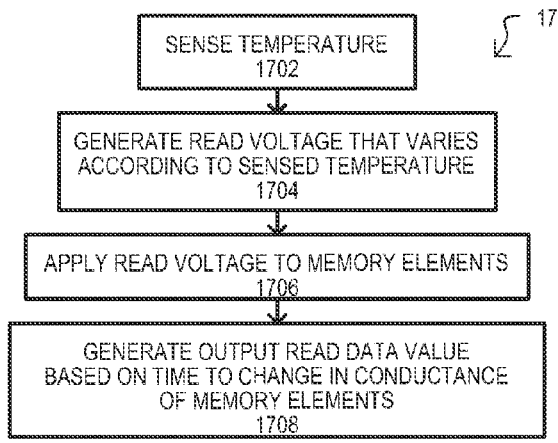
FIG. 17 is a flow diagram showing a temperature compensated read operation according to a further embodiment.

FIG. 17 shows a method 1700 that includes sensing a temperature (1702). A read voltage can then be generated that varies according to the sensed temperature (1704). Such an action can include varying read voltage magnitude, duration, or pulse count, as described herein, and equivalents.

A generated read voltage can then be applied to memory elements (1706). Output data values can then be generated based on a time to change in conductance of the memory elements (1708).

Figure 18:
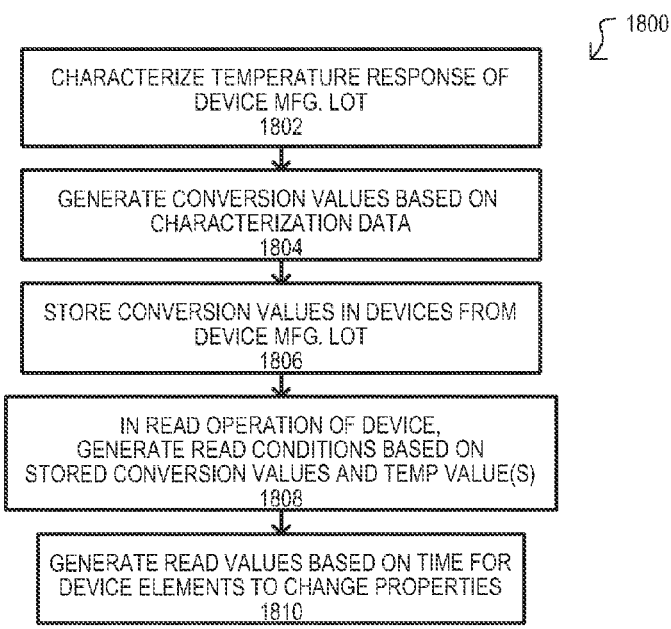
FIG. 18 is a flow diagram showing a temperature compensated memory device operation according to an embodiment.

FIG. 18 shows a method 1800 according to a further embodiment. A method 1800 can include storing sense values in a memory device based in previous temperature characterization of memory elements.

A method 1800 can include characterizing a temperature response of a device manufacturing lot (1802). Such an action can include generating data representing differences in time-to-change responses of memory elements based on fabrication variation, fabrication options, and/or materials used in a device, as but a few examples.

Conversion data can then be generated based on characterization data (1804). Such conversion data can enable circuits that generate read conditions, to further adjust such read conditions based on variations arising from manufacturing.

Conversion data can be stored in a device from the corresponding manufacturing lot (1806). In a read operation of the device, read conditions can be generated based on such stored data values and temperature values (1808). Read data values can then be generated based on a time-to-change in property of the elements within the device (1810).

Low Current Standby SET State

As noted above, embodiments of the invention can include memory elements programmable between different time-to-change property states. In particular embodiments, elements can be programmed between states by the application of electrical biases of opposing polarity. More particularly, elements can be written to a "SET" state from a "RESET" state (e.g., programmed) by application of a voltage of one polarity (e.g., positive) across terminals of an element. The element can then be returned to the RESET state (e.g., erased) by application of a voltage of a different polarity (e.g., negative) across the terminals of the element. SET and RESET states have different times-to-change in a property under the same read conditions.

In devices having large numbers of memory elements, it is desirable to reduce, as much as is practicable, the amount of current used in a writing operations. For example, some architectures can write large numbers of memory elements to one state (e.g., RESET) substantially simultaneously, in an operation similar to a "flash" erase in EEPROM devices.

Embodiments described below can maintain programmable elements at relatively high resistances in both SET and RESET states. Accordingly, when such elements are simultaneously written, less current can be drawn.

Embodiments also show a low current state that can be utilized to simultaneously place a large number of elements into a same state (e.g., a RESET state).

FIGS. 19A to 19D are a series of block schematic diagrams showing various operations of a memory device 1900 according to embodiments. FIGS. 19A to 19D show programmable elements (one shown as 1902) coupled to a biasing circuit 1904.

Figure 19A:
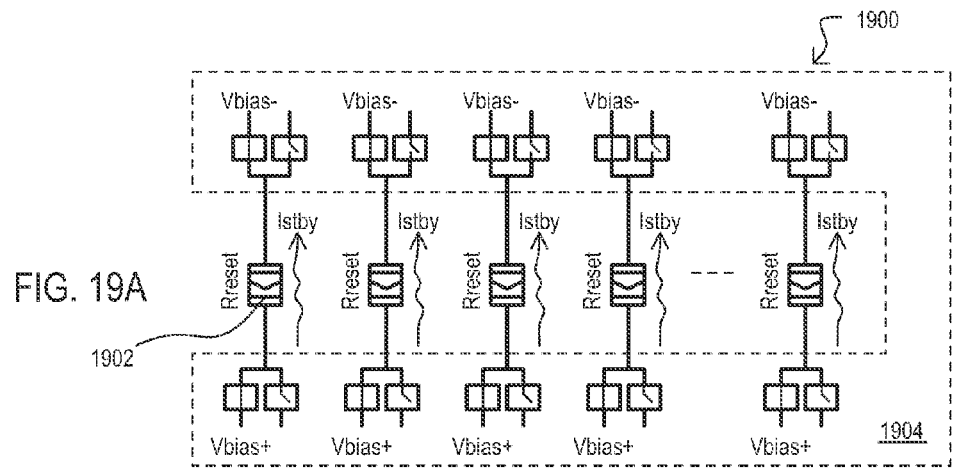
FIGS. 19A to 19D are block schematic diagrams showing various operations, including a standby operation, of a memory device according to embodiments.

FIG. 19A shows memory elements 1902 in a standby state. A standby state can be state when devices are not being accessed in a read or write operation. In a standby state, elements 1902 can be subject to a low voltage, low current bias, at a polarity that reinforces one state (in this case the RESET state). Accordingly, as shown in FIG. 19A, programmable elements 1902 can be biased with a bias voltage Vbias, which in this embodiment is a negative bias voltage. In such a bias state, a standby current (Istby) can flow through the elements. It is emphasized that the standby bias voltage (Vbias) and standby current (Istby) can be orders of magnitude smaller than currents and/or voltages used to read and/or write to the elements.

In the embodiment of FIG. 19A, all elements 1902 are in a RESET state having a relatively high resistance Rreset. Further, a standby current (Isbty) can reinforce a RESET state, and thus serve to maintain such elements in the RESET state.

It is understood that the biasing shown in FIG. 19A can be static (e.g., constantly applied in the standby state), or can be dynamic (periodically applied in the standby state).

Figure 19B:
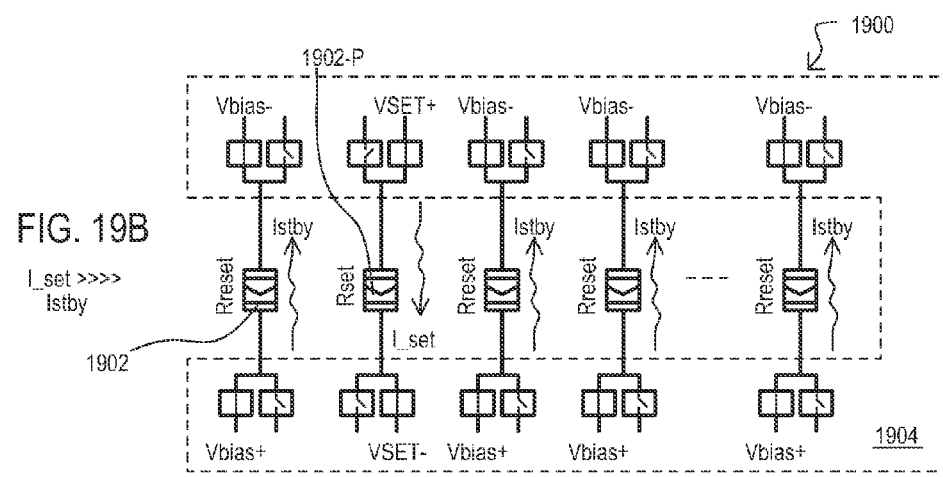

FIG. 19B shows memory elements 1902 in a "SET" write operation. Element 1902-P is programmed to the SET state by applying a set bias voltage across the element. However, it is noted that a resulting resistance of the set element Rset can be relatively high. A relatively high resistance can be resistance greater than the element after it has undergone a dynamic change in conductance, due to the application of read bias conditions. While one element is programmed to a set state, other elements can have no bias, or can be maintained at the standby bias level.

A current generated through programmed element 1902-P (I_set) can be substantially larger than (and opposite in direction to) the standby current Istby shown in FIG. 19A.

Figure 19C:
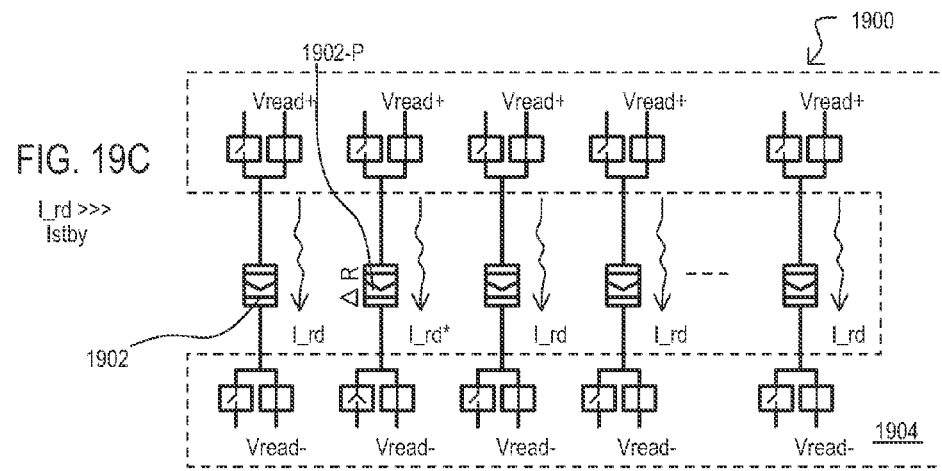

FIG. 19C shows memory elements 1902 in read operation. A read bias (Vread) can be applied to elements. Because element 1902-P is programmed to the SET state, such an element can undergo a change in property, which in this embodiment can be change in conductance (ΔR). Thus, element 1902-P can experience a dynamic change in resistance, and a read current I_rd* will reflect such a change.

A read current generated through the programmed element 1902-P (I_rd*), particularly after the element has undergone change in property, can be larger than Istby.

Figure 19D:
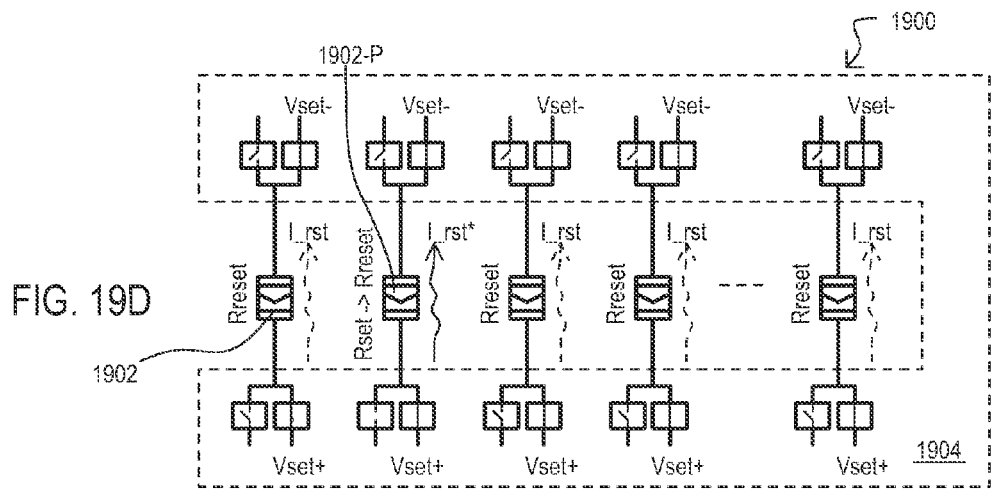

FIG. 19D shows memory elements 1902 in a group write operation. All memory elements are subject to a SET bias voltage (Vset). Element 1902-P was previously in the SET state, thus the application of Vset can cause the element 1902-P to be placed into the RESET state. Consequently, its resistance can change from Rset to Rreset. However, because Rset is relatively high, a total current utilized in the group write operation can be relatively small. This is in sharp contrast to conventional CBRAM cells, which can draw considerable current when programmed to a low resistance state.

In this way, a memory with time-to-change elements can have a standby state in which a very low bias is applied which tends to maintain such elements in a relatively high resistance state.

Figure 20:
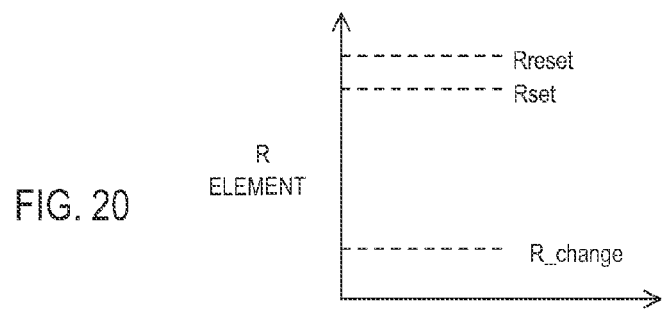
FIG. 20 is a graph showing resistance states of elements such as those shown in FIGS. 19A to 19D.

FIG. 20 is graph showing resistance states of elements such as those shown in FIGS. 19A to 19D. Both a RESET resistance Rreset and a SET resistance Rset can be substantially larger than an element after it undergoes a change in conductance (R-change).

In particular embodiments, bias circuits can be configured to provide a standby current through memory elements that does not substantially vary according to a resistance of the element.

Figure 21A:
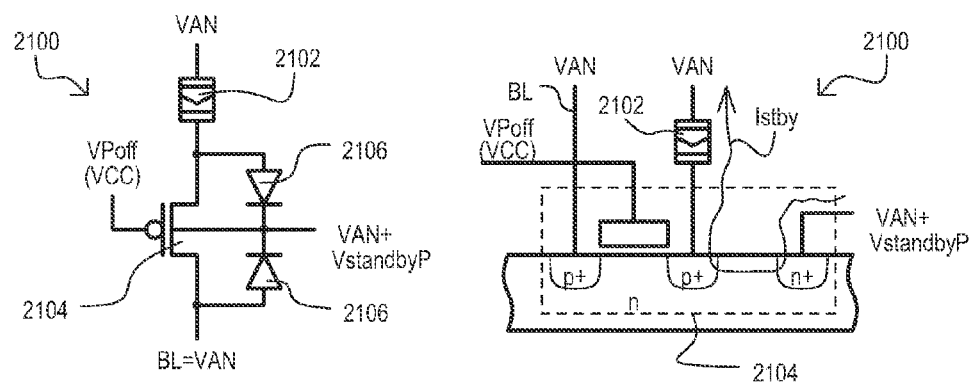
FIGS. 21A to 21C are a series of views showing standby biasing arrangements according to embodiments.
Figure 21B:
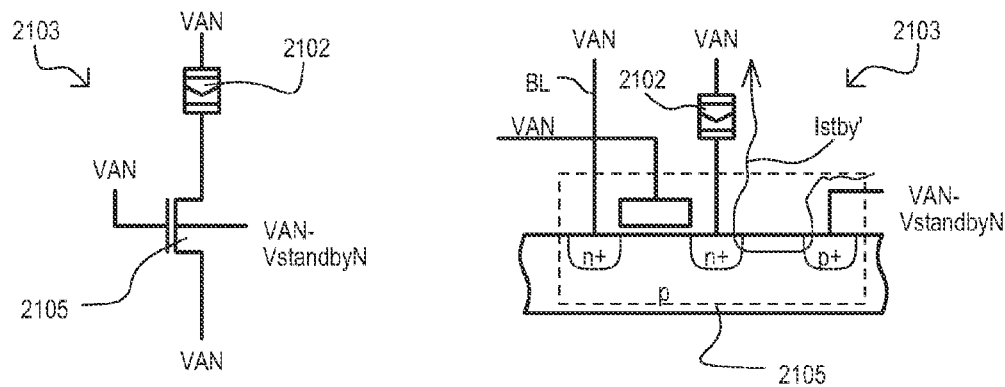
Figure 21C:
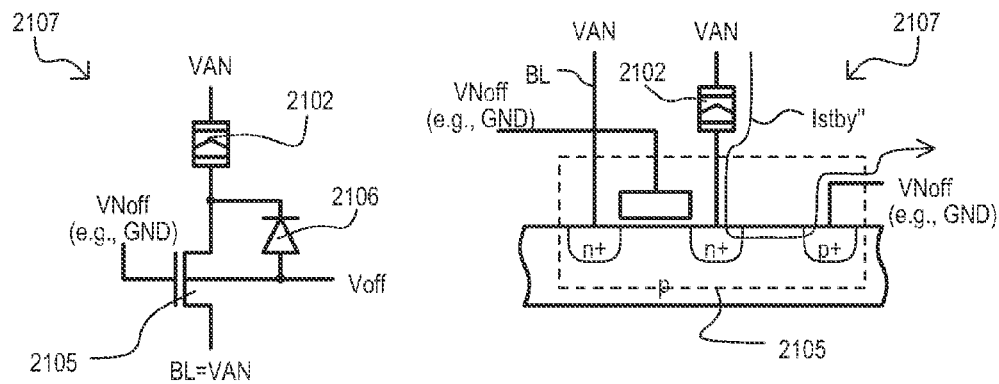

FIGS. 21A to 21C show examples of standby biasing approaches according to various embodiments. The various embodiments show how a reverse p-n junction leakage can be utilized to generate a standby current. As a resistance of an element decreases, a junction reverse bias can increase, lowering a resulting standby current. In this way, a bias current can automatically adapt to a resistance of an element.

Each of FIGS. 21A to 21C shows a programmable memory element connected to an insulated gate field effect (e.g., MOS) transistor structures. It is understood that such connections can be by way of any suitable intervening devices. The arrangements are represented by schematic diagrams and cross sectional views.

FIG. 21A shows a standby current generator 2100 realized with a p-channel transistor 2104. Transistor 2104 can have a memory element 2102 with a first terminal connected (directly or indirectly) to a source of transistor 2104. The other terminal of the memory element 2102 can be connected to a voltage VAN. A gate of transistor 2104 can receive an "off" bias voltage, which can be a high supply voltage (VCC) in the embodiment shown. A drain of transistor 2104 can receive the voltage VAN. A body of transistor 2104 can be biased to a voltage VAN+VstandbyP. A drain of transistor 2104 can be connected (directly or indirectly) to a bit line (BL).

Under such biasing conditions, p-n junctions (represented by diodes 2106) can be reverse biased, causing a standby current Istby to flow through memory element 2102.

FIG. 21B shows a standby current generator 2103 realized with an n-channel transistor 2105. Transistor 2105 can have a memory element 2102 connected (directly or indirectly) to a drain at a first terminal, and to a voltage VAN at a second element terminal. Voltage VAN can be 0V in one embodiment. A gate and drain of transistor 2105 can also receive the VAN voltage. A body of transistor 2105 can be biased to a voltage VAN-VstandbyN. A source of transistor 2105 can be connected (directly or indirectly) to a bit line (BL).

Under such biasing conditions, p-n junctions of transistor 2105 can be reverse biased, causing a standby current Istby' to flow through memory element 2102.

FIG. 21C shows a standby current generator 2107 also realized with an n-channel transistor 2105, but having a current flow in the reverse direction to that shown in FIG. 21B. Transistor 2105 can have a memory element 2102 connected (directly or indirectly) to a source at a first terminal, and to a voltage VAN at a second element terminal. Voltage VAN can be a positive voltage in this arrangement. A gate of transistor 2105 can receive an "off" voltage, which can be 0V in the embodiment shown. A drain of transistor 2105 can receive the VAN voltage. A body of transistor 2105 can be biased to the off voltage (e.g., 0V). A drain of transistor 2105 can be connected (directly or indirectly) to a bit line (BL).

Under such biasing conditions, p-n junctions (represented by diode 2106) can be reverse biased, causing a standby current Istby" to flow through memory element 2102.

It is noted that in the embodiments shown above, if one element has a lower resistance (e.g., it is in the SET state), a reverse bias across the p-n junction can increase, maintaining, or possibly even reducing the standby current flowing through the element.

As noted above, standby biasing conditions as described above can reinforce a first state (e.g., RESET) of a memory element. However, for some memory element types, such standby bias conditions could tend to "slowly" program memory elements in the second state (e.g., SET) to the reinforced state (RESET). Embodiments of the invention can periodically check resistances to ensure that elements are maintained in their intended states.

Figure 22:
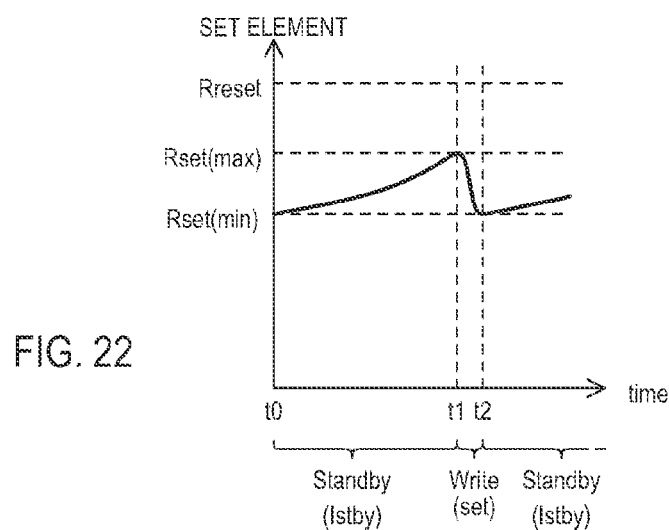
FIG. 22 is a timing diagram showing monitoring operation according to an embodiment.

FIG. 22 is a graph showing a monitoring and program operation according to an embodiment. In FIG. 22, a Y-axis shows resistance values an element. An X-axis shows actions occurring over time in the monitor and program operation.

Referring to FIG. 22, prior to time t0, a memory element can be programmed to a SET state, and thus exhibit a minimum SET resistance Rset(min).

At time t0, standby bias conditions can be applied to the element, to ensure it maintains the relatively high resistance Rset(min).

Between times t0 and t1, under the standby bias conditions, the element can begin to slowly "program" to the RESET state. As a result, its resistance can slowly rise over time.

At time t1, a memory element resistance can rise to a maximum value Rset(max). Once such a resistance rise is detected, the element can be programmed once again to the SET state, reducing its resistance to about the Rset(min) level. At time t2, standby bias conditions can applied once again.

Figure 23A:
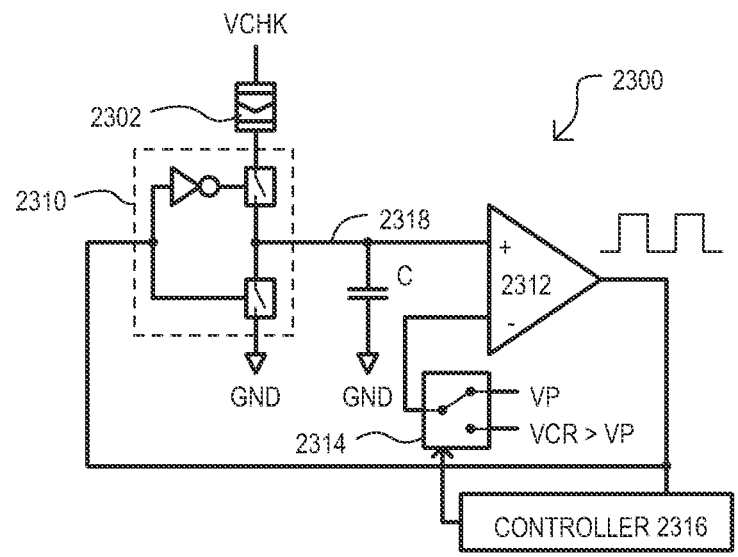
FIGS. 23A and 23B are block schematic diagram showing detection circuits according to embodiments.
Figure 23B:
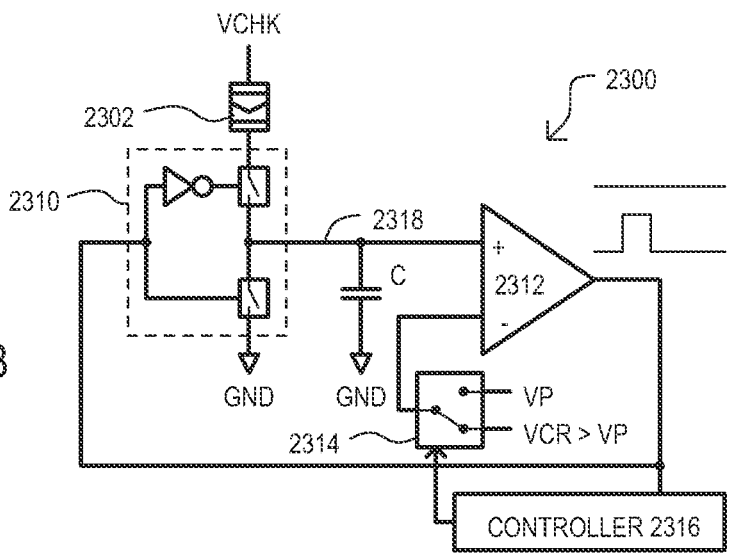

FIGS. 23A and 23B show a detection circuit 2300 according to an embodiment. A detection circuit 2300 can measure a resistance of a programmable element 2302. A detection circuit 2300 can include a feedback switching section 2310, a capacitor C, an amplifier 2312, a mode switch 2314, and a controller 2316.

FIG. 23A shows an initial monitoring operation. Mode switch 2314 can connect a first voltage VP to a (−) input of amplifier 2312. A voltage VP can be a very low voltage, close to ground GND. A programmable element 2302 can then be connected to a monitor node 2318 by feedback switching section 2310. An output of amplifier 2312 can be low.

Capacitor C can charge monitor mode 2318 toward a voltage VCHK through element 2302. Once a voltage at monitor mode 2318 exceeds VP, amplifier 2312 can switch high, causing feedback switching section 2310 to disconnect element 2302 from monitor mode 2318, and connect monitor node 2318 to ground.

Capacitor C can discharge monitor mode 2318 toward GND. Once a voltage at monitor mode 2318 falls below VP, amplifier 2312 can return low, causing feedback switching section 2310 to disconnect monitor mode 2318 from ground, and connect it once again to element 2302.

Such charging and discharging can thus occur at a period corresponding to a resistance of element 2302 and a capacitance of capacitor C. Thus, a frequency of a signal output from amplifier 2312 can represent a monitored resistance.

A controller 2316 can monitor an output of amplifier 2312 to determine if a frequency is too low, indicating a resistance of element 2302 is too high (e.g., at Rset(max) as shown in FIG. 22).

FIG. 23B shows a read operation of detection circuit 2300. If controller 2316 determines a resistance of element 2302 is too high, it can operate mode switch 2314 to connect a second voltage VCR to a (−) input of amplifier 2312, where VCR>VP.

Operations can occur as noted for FIG. 23A. However, such a higher voltage VCR can be sufficient to lower a resistance of element 2302. A controller 2316 can monitor an output of amplifier 2312 to determine if a target frequency is reached, indicating a resistance of element 2302 is now to a desired lower level (e.g., at Rset(min) as shown in FIG. 22).

The above descriptions have shown structure and corresponding methods for various embodiments. Particular methods according to additional embodiments will now be described in series of flow diagrams.

Figure 24:
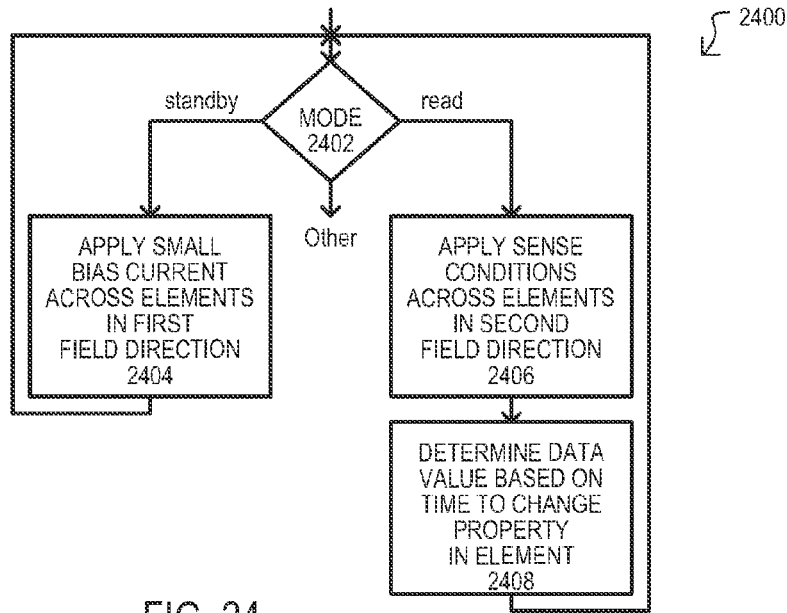
FIG. 24 is a flow diagram showing a memory device method of operation according to an embodiment.

FIG. 24 is a flow diagram showing a memory device method 2400 according to an embodiment. A method 2400 can switch between modes of operation, including a low current standby mode.

Method 2400 can include determining a mode of operation 2402. If a mode is a standby mode, a method 2400 can apply a small bias current across memory elements in a first field direction 2404. Such biasing can be according to the various embodiments show herein, or equivalents.

If a mode is a read mode, a method 2400 can apply sense conditions across memory elements in a second field direction 2406. A data value of the memory elements can then be determined based on a time to change property in the element under the sense conditions 2408.

Figure 25:
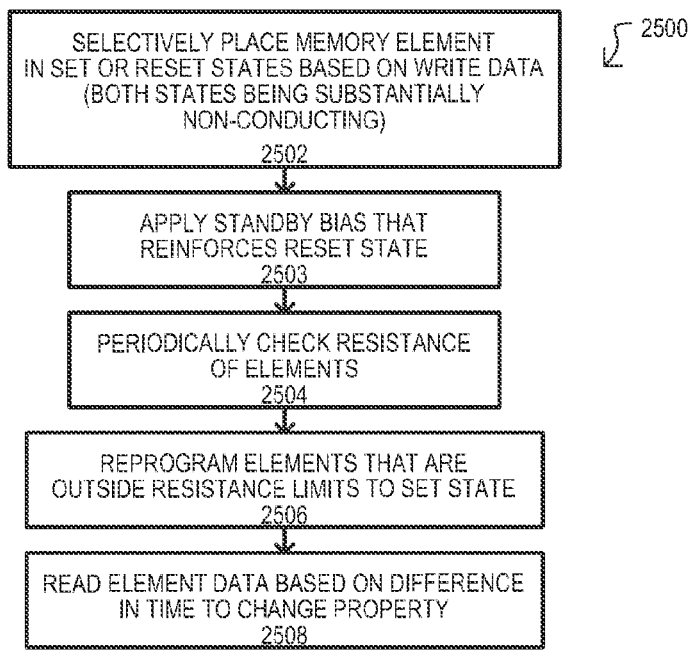
FIG. 25 is a flow diagram showing a memory device method of operation according to a further embodiment.

FIG. 25 is a flow diagram of a method 2500 that can apply a standby bias that reinforces a first state, and then periodically check element properties to ensure elements in a second state do not drift into the first state.

A method 2500 can include selectively placing a memory element in a set or reset state based on a write data, where both states are substantially non-conducting 2502. Such an action can program memory elements to different time-to-change property responses, while keeping elements of both states (i.e., RESET and SET) at a relatively high resistance. A standby bias can then be applied that reinforces the RESET state 2503. In a particular embodiment, a standby bias can be a low current bias as shown herein, or an equivalent.

Periodically, a resistance of elements can be checked 2504. In particular embodiments, such an action can detect SET elements whose resistance can be too high, indicating such an element can be approaching the RESET state.

A method 2500 can reprogram elements determined to be outside of a resistance range to a SET state 2506. Data can then be read from elements based on a difference in time to change properties 2508.

Self-Referenced Read Operations for Time-to-Change Memory Elements

As noted above, memory elements programmable between different time-to-change property states can exhibit some variation in response to operating factors, such as temperature.

According to embodiments shown below, read operations can include accessing an element twice and determining a data value stored based on a difference in time-to-change property in the two access operations. Such approaches can determine a data value stored by an element regardless of variations between elements. That is, read operations can be self-referenced.

In some embodiments above, sense operations including determining one data value is stored (e.g., RESET) if a change in property does not occur within a predetermined time period. In the embodiments shown below, a change in property is induced for both a RESET and SET states.

Figure 26:
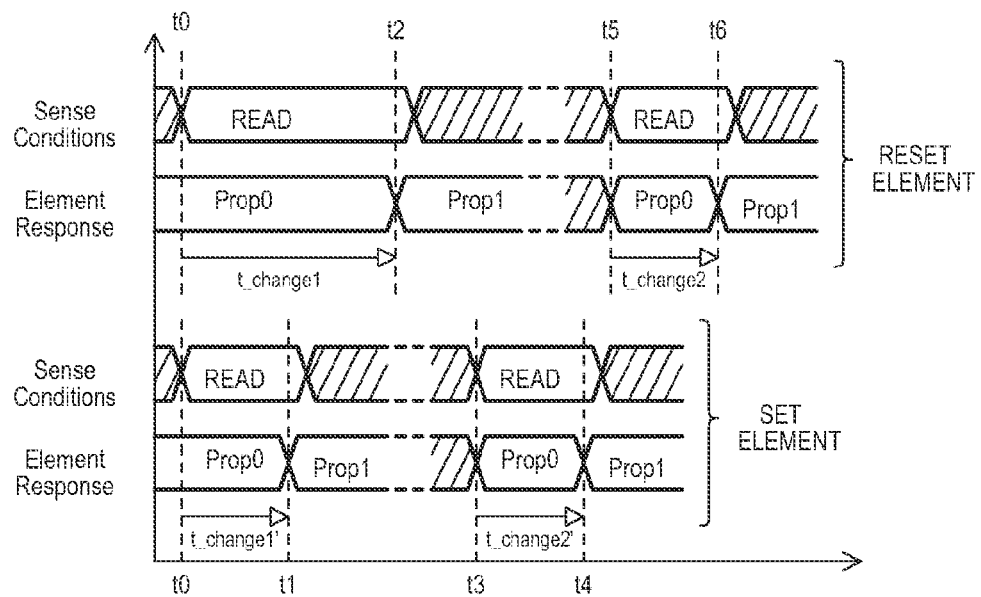
FIG. 26 is a timing diagram showing read operations according to another embodiment.

FIG. 26 is a graph showing read operations according to an embodiment.

FIG. 26 includes waveforms showing sense conditions (Sense Conditions) and an element response (Element Response) for elements in both a SET state (SET ELEMENT) and RESET state (RESET ELEMENT).

Referring first to the RESET ELEMENT response, at time t0, sense conditions can be applied to the RESET element. The RESET element can initially exhibit a first property (Prop0). At about time t2, the RESET element can dynamically change to a second property (Prop1). Thus, a time-to-change can be t2-t0, which is shown as t_change1.

At time t5, sense conditions can once again be applied to the same RESET element. The RESET element can initially exhibit the first property (Prop0) once again. However, at about time t6, the RESET element can dynamically change to the second property (Prop1). Thus, a time-to-change can be t6-t5, which is shown as t_change2.

Because t_change1 is substantially greater than t_change2, an element can be sensed as having the RESET state.

Referring now to the SET ELEMENT response, at time t0, sense conditions can be applied to the SET element. The SET element can initially exhibit a first property (Prop0). At about time t1, the SET element can dynamically change to a second property (Prop1). Thus, a time-to-change can be t1-t0, which is shown as t_change1'.

At time t3, sense conditions can once again be applied to the same SET element. The SET element can again exhibit the first property (Prop0). At about time t4, the SET element can dynamically change to the second property (Prop1). Thus, a time-to-change can be t4-t3, which is shown as t_change2'.

Because t_change1' is not substantially greater than t_change2', an element can be sensed as having the SET state.

In this way, a time-to-change property in two subsequent read operations can be compared to determine a data value stored in a memory element.

Figure 27:
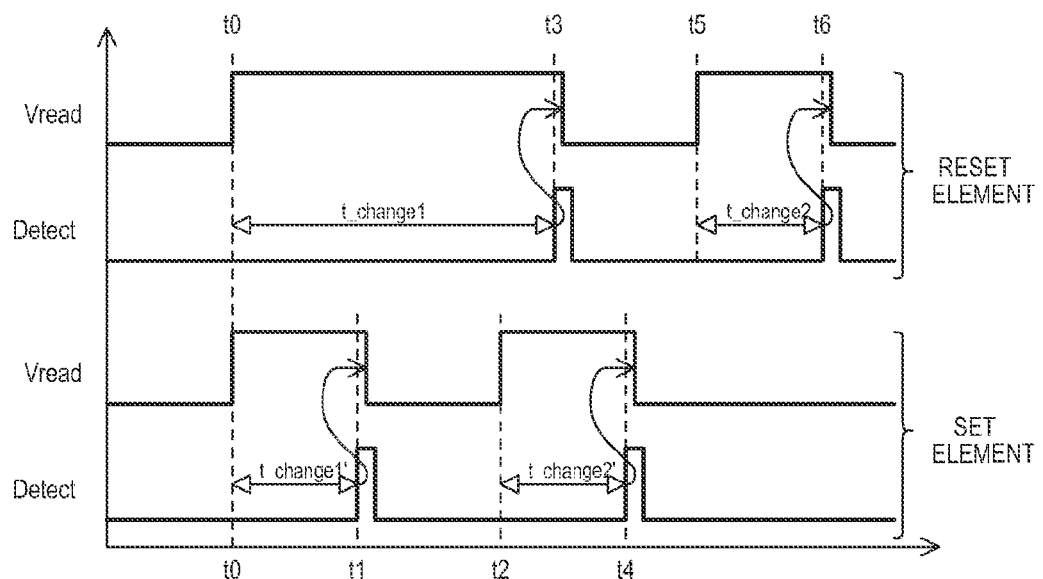
FIG. 27 is a timing diagram showing read operations according to another embodiment.

FIG. 27 shows a graph of a read response according to another embodiment.

FIG. 27 includes waveforms showing an applied read bias voltage (Vread) and a resulting detect signal (Detect) corresponding to elements in both a SET state (SET ELEMENT) and RESET state (RESET ELEMENT). A detect signal (Detect) can transition high when a change in element property is detected. Further, FIG. 27 shows a self-limited read operation in which an active detect signal (Detect) can disable an applied read voltage (Vread).

Referring first to the RESET ELEMENT response, at time t0, a read bias voltage Vread can be applied to the RESET element. At time t3, a change in property can be detected and signal Detect can transition high. In response to such a high Detect signal, read bias voltage can be removed. A time-to-change can be t3-t0, which is shown as t_change1.

At time t5, a read bias voltage Vread can once again be applied to the same RESET element. At time t6, a change in property can be detected and signal Detect can transition high, disabling read bias voltage Vread. A time-to-change can be t6-t5, which is shown as t_change2.

Because t_change1 is substantially greater than t2, an element can be sensed as having the RESET state.

Referring now to the SET ELEMENT response, operations can occur in the same general fashion as the RESET element. However, because a first time-to-change property (t_change1') is not substantially greater than a second time-to-change property (t_change2'), an element can be sensed as having the SET state.

Figures 28A, 28B:
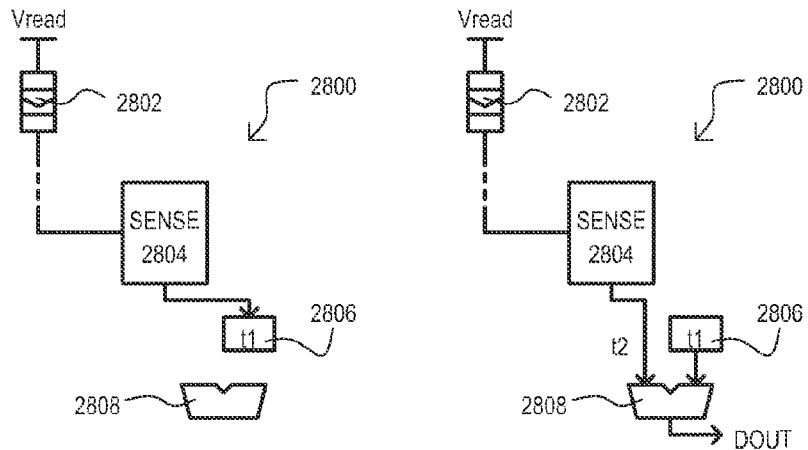
FIGS. 28A and 28B are block schematic diagram showing a memory device according to a further embodiment.

FIGS. 28A and 28B show a memory device 2800 according to an embodiment. A memory device 2800 includes a memory element 2802, a sense section 2804, a storage circuit 2806, and a compare section 2808.

FIG. 28A shows memory device 2800 performing a first read operation on an element 2802. A read bias voltage Vread can be applied to an element. Sense section 2804 can sense a time between the application of Vread and a change in property in element 2802. Such a value can be stored in storage circuit 2806 as value "t1".

FIG. 28B shows memory device 2800 performing a second read operation on an element 2802. A read bias voltage Vread can again be applied to an element. Sense section 2804 can sense a time between the application of Vread and a change in property in element 2802. Such a value can be provided to compare section 2808 as value "t2". In addition, value t1 can be applied to compare section 2808 from storage circuit 2806. Compare section 2806 can compare t1 to t2 to determine a type of data value.

In this way, a memory device include a sense circuit that measures time-to-change in property in an element, and a compare circuit that compares such times to determine a stored data value.

Figure 29:
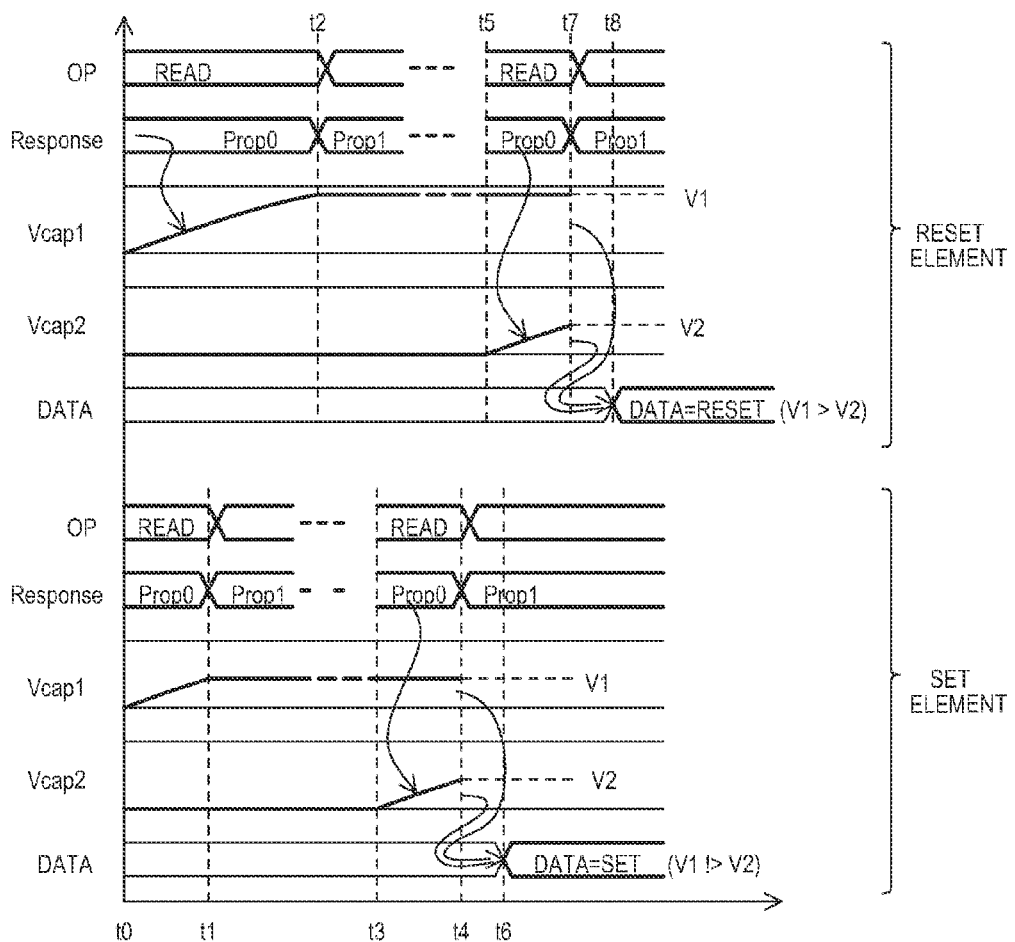
FIG. 29 is a timing diagram showing read operations according to another embodiment.

FIG. 29 is a graph showing read operations according to another embodiment. FIG. 29 shows a read operation in which a charge on a capacitance can be used to measure a time to change-in-property.

FIG. 29 includes waveforms showing an operation (OP), an element response (Response), a first capacitor voltage (Vcap1), a second capacitor voltage (Vcap2), and a resulting data output (DATA) for elements in both a SET state (SET ELEMENT) and RESET state (RESET ELEMENT).

Referring first to the RESET ELEMENT response, at time t0, a first read operation can begin. The RESET element can initially exhibit a first property (Prop0). While the element exhibits this first property, a first capacitor can be charged, thus Vcap1 can start to rise.

At about time t2, the RESET element can dynamically change to a second property (Prop1). In response to such a change, a charging of the first capacitor can cease, thus a first capacitor can store a voltage V1.

At time t5, a second operation can begin. The RESET element can initially exhibit a first property (Prop0). While the element exhibits this first property, a second capacitor can be charged, thus Vcap2 can start to rise.

At about time t7, the RESET element can dynamically change to a second property (Prop1). In response to such a change, a charging of the second capacitor can cease, thus a second capacitor can store a voltage V2.

At about time t8, voltages on first and second capacitors (V1, V2) can be compared to one another. Because V1 is substantially greater than V2, a data value can correspond to the RESET state.

Referring now to the SET ELEMENT response, operations can occur in the same general fashion as the RESET element. However, because a time-to-change in a first read operation is not substantially longer than the corresponding second read operation, a voltage V1 is not substantially greater than V2. Consequently, a data value can correspond to the SET state.

FIGS. 30A to 30F are block schematic diagrams showing a memory device 3000 and corresponding operations according to additional embodiments. FIGS. 30A to 30F show a memory device 3000 that can perform a sensing operation like that of FIG. 29, using an inherent bit line capacitance to store charge corresponding to a time-to-change property.

Memory device 3000 can include memory elements (one shown as 3002) connected to bit lines (BL00 to BL11) by corresponding access devices (one shown as 3012). Bit lines (BL00 to BL11) can be connected to a sense amplifier circuit 3004 by select switch devices 3010-00 to -11. Charge circuits 3016-0/1 can charge bit lines in response to an output of sense amplifier circuit 3004.

Figure 30A:
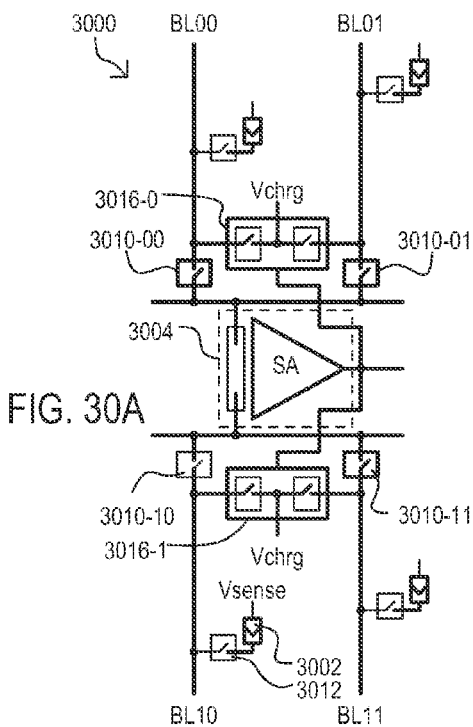
FIGS. 30A to 30F are block schematic diagram showing a memory device an operations according to a further embodiment.

FIG. 30A shows a memory device 3000 prior to a read operation. Memory elements (e.g., 3002) may not be connected to bit lines BL00-11 and bit lines BL00-11 may not be connected to sense amplifier circuit 3004.

Figure 30B:
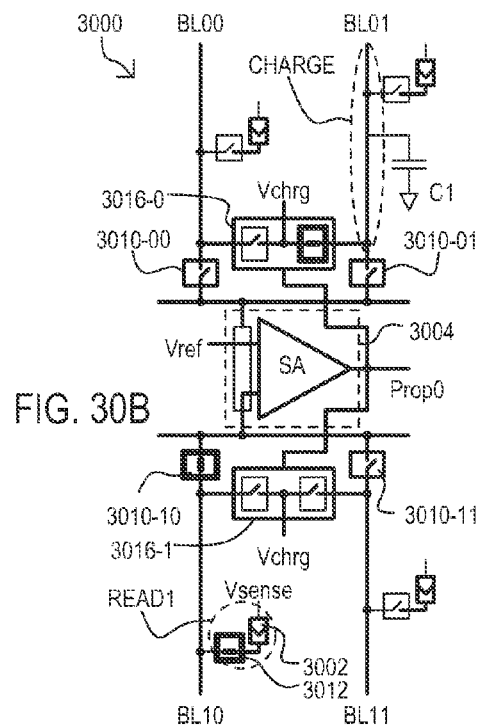

FIG. 30B shows an initial portion of a first read action. Access device 3012 can connect memory element 3002 to bit line BL10. Further, select switch device 3010-10 can connect bit line BL10 to a first input of sense amplifier circuit 3004, while a second input of sense amplifier circuit 3004 can be connected to a reference voltage Vref. A sense amplifier circuit 3004 output can correspond to a first property (Prop0).

In response to output Prop0 from sense amplifier circuit 3004, charge circuit 3016-0 can charge bit line BL01 according to charge source Vchrg. Bit line BL01 can have an inherent capacitance C1, and thus begin to charge.

Figure 30C:
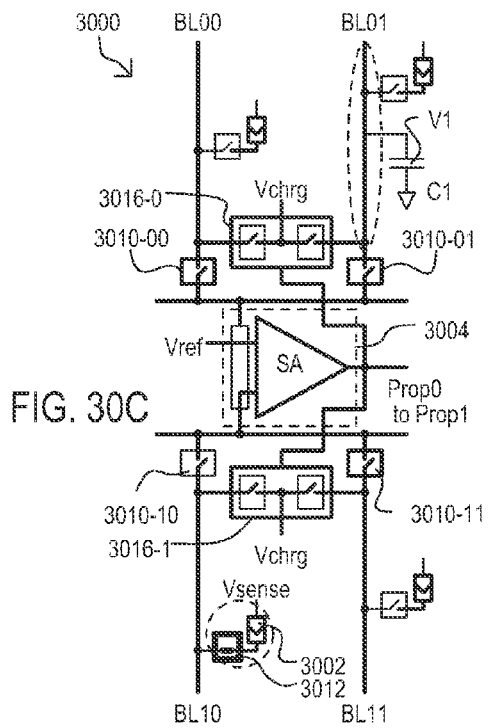

FIG. 30C shows an ending portion of a first read action. Memory element 3002, which is still connected to bit line BL10 can undergo a change in property (Prop0 to Prop1). As a result, a sense amplifier circuit 3004 output can correspond to a second property (Prop1).

In response to output Prop1 from sense amplifier circuit 3004, charge circuit 3016-0 can disconnect bit line BL01 from charge source Vchrg. Bit line BL01 can now store a voltage (V1) on capacitor C1 corresponding to the charging time (i.e., the amount of time element 3002 exhibited the first property).

Figure 30D:
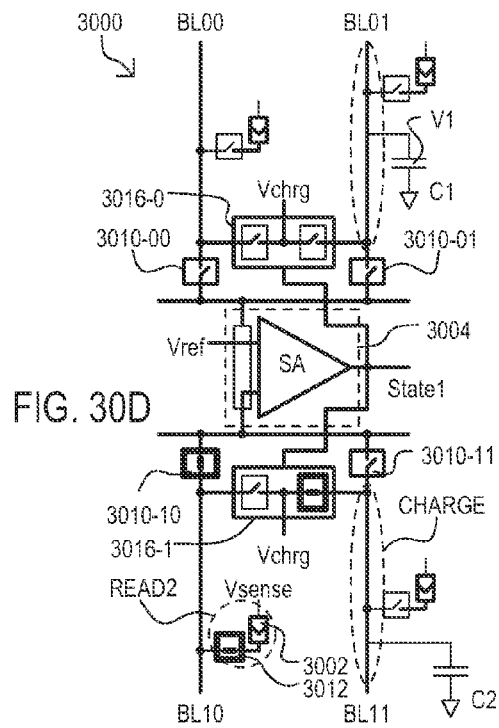

FIG. 30D shows an initial portion of a second read action. A state of memory element 3002 can be sensed in the same fashion as FIG. 30B. However, unlike FIG. 30B, in response to output Prop0 from sense amplifier circuit 3004, charge circuit 3016-1 can charge bit line BL11 according to charge source Vchrg. Bit line BL11 can have an inherent capacitance C2 that is substantially the same as C1. At this time, bit line BL01 continues to hold voltage V1.

Figure 30E:
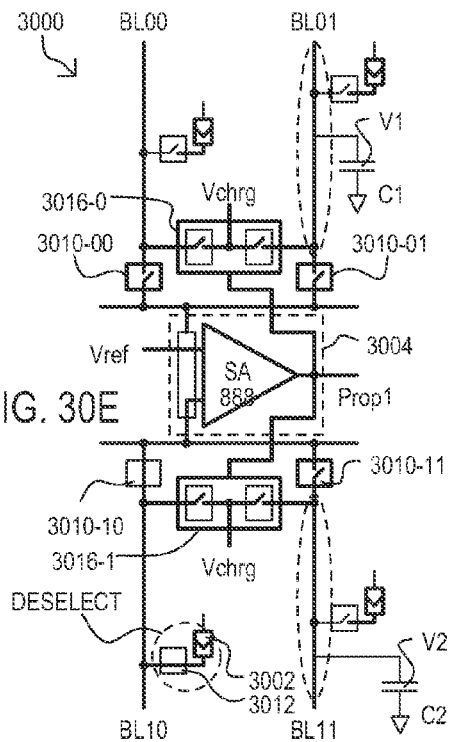

FIG. 30E shows an ending portion of a second read action. Memory element 3002, which is still connected to bit line BL10 can undergo a change in property (Prop0 to Prop1). As a result, a sense amplifier circuit 3004 output can correspond to a second property (Prop1). In response, charge circuit 3016-1 can disconnect bit line BL11 from charge source Vchrg. Bit line BL11 thus stores a voltage (V2) on capacitor C2 corresponding to the charging time.

Figure 30F:
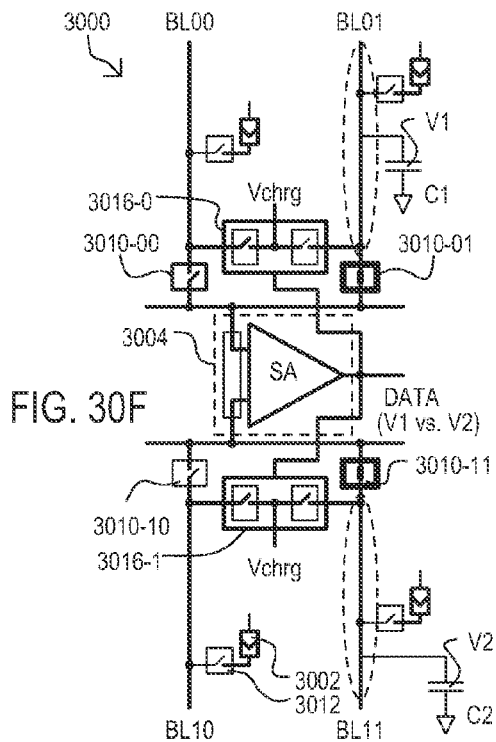

FIG. 30F shows a read data generation action. All memory elements (e.g., 3002) can be disconnected from their respective bit lines (BL00-11) by corresponding access devices (e.g., 3012). Bit line BL01, which has been charged to voltage V1 is connected to one input of sense amplifier circuit 3004 by select switch device 3010-01. At the same time, bit line BL11, which has been charged to voltage V2 is connected to a second input of sense amplifier circuit 3004 by select switch device 3010-11. Sense amplifier circuit 3004 can output a data value based on a comparison between voltages V1 and V2.

Figure 31:
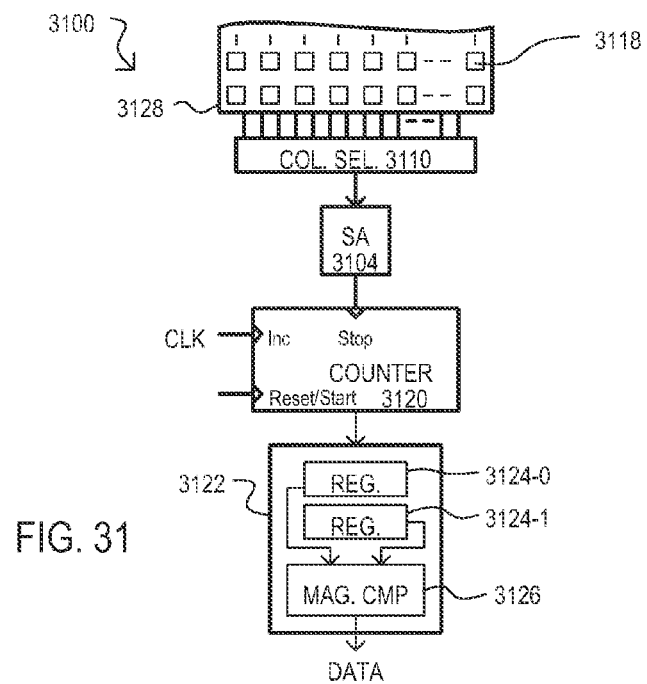
FIG. 31 is a block schematic diagram showing a memory device according to another embodiment.

FIG. 31 is a block schematic diagram showing a memory device 3100 according to another embodiment. A memory device 3100 can include a counter to time different times to change in property of memory elements.

A memory device 3100 can include a memory cell array 3128, a column selector circuit 3110, a sense amplifier 3104, a counter circuit 3120, and a compare circuit 3122. It is understood that such structures can be repeated multiple times in parallel for each data bit output from a device.

A memory cell array 3128 can include memory cells (one shown as 3118) arranged into rows and columns. Memory cells 3118 can each include one or more memory elements programmable between two or more different states, where each state corresponds to a different time-to-change in property as described in embodiments herein, and equivalents.

Column selector circuit 3110 can connect a memory element within memory cell array 3128 to sense amplifier circuit 3104. Sense amplifier circuit 3104 can generate an output value based on detected properties of a memory element.

A counter circuit 3120 can output a count value in response to a Reset/Start input and an increment input (Inc). In one embodiment, in a first read operation, a counter circuit 3120 can start counting from a base value at the start of a read operation. Counting can occur in response to a clock signal CLK. In response to a change in property of a sensed element, a counter circuit 3120 can stop a count. Such a count can be output and stored in a first register 3124-0 within compare circuit 3122. A counter circuit 3120 value can then be reset.

The above counting operation can be repeated for a second read operation to the same memory element. A resulting count value can by output and stored in a second register 3124-1 within compare circuit 3122.

A magnitude comparator 3126 can compare values stored within first and second registers 3124-0/1 to generate a read data value.

It is understood that FIG. 31 is but one embodiment. Alternate embodiments can utilize various other counting methods and/or circuits.

Figure 32:
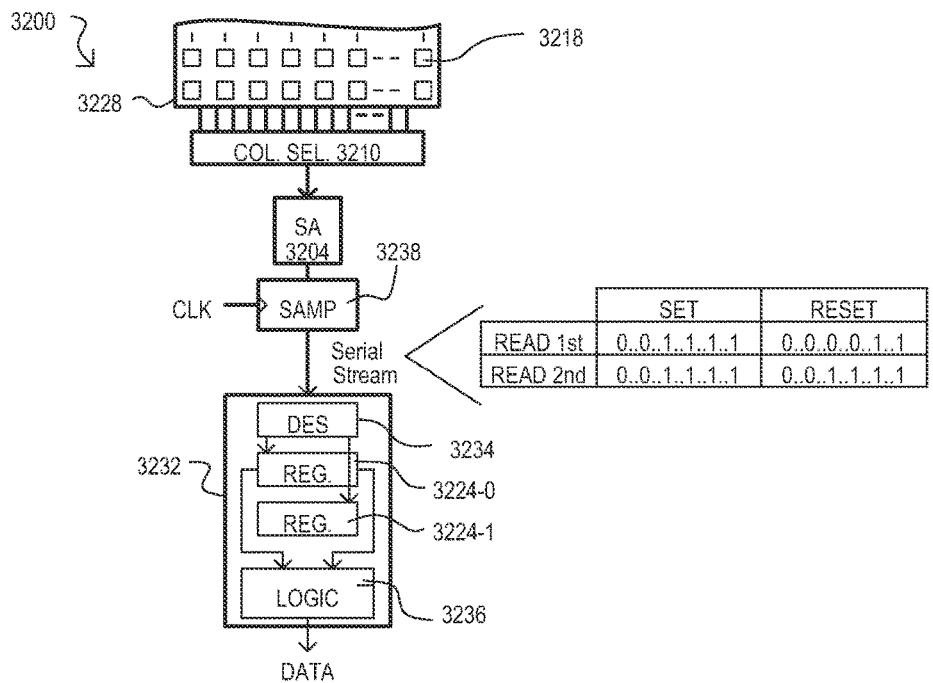
FIG. 32 is a block schematic diagram showing a memory device according to another embodiment.

FIG. 32 shows a memory device 3200 according to a further embodiment. A memory device 3200 can compare sense value sequences to arrive at an output data value. Memory device 3200 can include items like that of FIG. 31, and such like items have the same reference character but with the first digits being "32".

Unlike FIG. 32, a memory device 3200 includes a sampling circuit 3238, a compare circuit 3232 with a deserializer 3234, first and second registers 3224-0/1, and a compare logic 3236.

A sampling circuit 3238 can periodically output a value from sense amplifier 3204 in response to a signal CLK. Thus, sampling circuit 3238 can output a serial data stream reflecting a sense amplifier 3204 at different points in time. Such bit streams can be deserialized by deserializer 3234. A resulting value from two read operations to a same memory element can be stored in registers 3224-0/1. Compare logic 3236 can compare values stored within first and second registers 3224-0/1 to generate a read data value.

Figure 33:
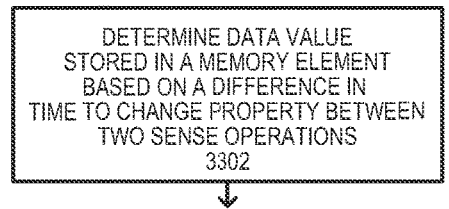
FIG. 33 is a flow diagram showing a method according to another embodiment.

FIG. 33 is a flow diagram showing a method 3300 according to an embodiment. A method 3300 can include determining a data value stored in a memory element based on a difference in a time-to-change property between two sense operations 3302. Such an approach provides a self-referencing sensing operation, which can make data sensing operations of one memory element independent of other memory elements or variations in operation conditions and/or variations arising from manufacturing.

Figure 34:
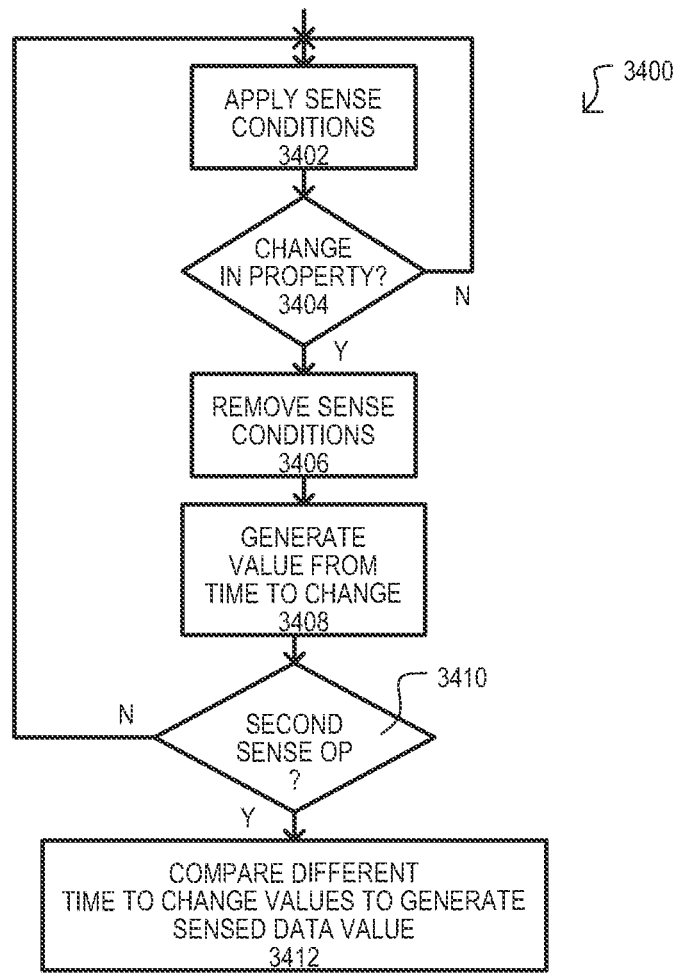
FIG. 34 is a flow diagram showing a method according to a further embodiment.

FIG. 34 shows a method 3400 according to a further embodiment. A method 3400 can compare two sense operations results for the same element to determine a stored data value. A method 3400 can include applying sense conditions to a memory element 3402. If a change of property is not detected (N from 3404), sense conditions can continue to be applied. However, if a change in property is detected (Y from 3404), sense conditions can be removed from an element (3406) and a value can be generated from a time-to-change in property (3408).

If a sense operation is not a second sense operation (N from 3410), another sense operation can occur, with method 3400 returning to 3402. If a sense operation is a second sense operation (Y from 3410), different time-to-change values can be compared to generate a sensed data value (3412).

Low Energy Program Operations for Time-to-Change Memory Elements

As noted above, embodiments can include memory elements that can be programmed into states with different times to change in property under sense conditions. In some embodiments, a programming of elements can be accomplished with a low voltages and currents as compared to conventional approaches, such as those used to program CBRAM type elements.

In some embodiments, elements can have a RESET state with a relatively longer time-to-change in property. Such elements can be programmed to a SET state (having relatively a lower time-to-change) with a low voltage and very low current compliance requirements. In very particular embodiments, programming to a SET state with such low energy does not substantially form conduction paths through an element. Instead, a foundation for forming conduction paths can be created. Subsequent read operations to such SET elements can utilize such a foundation to dynamically create conduction paths faster than the RESET case. Such a feature can enable multiple devices to be placed in a SET state with relatively low power consumption. Such low power consumption can be particularly advantageous when placing large numbers of devices to the SET state in parallel.

FIGS. 35A to 35D are a sequence of block schematic diagrams showing a memory device 3500 and corresponding operations according to an embodiment. A memory device 3500 can include memory elements (one shown as 3502) programmable between different times-to-change in property as described herein, and equivalents. Memory elements (e.g., 3502) can be connected to a bit line 3504 by corresponding access devices (e.g., 3506). Bit line 3504 can be connected to a current sense amplifier 3510 by a select switch 3508 and to a RESET voltage by a select switch 3514. Current sense amplifier 3510 can provide an output to controller 3512. Controller 3512 can control select switches 3508 and 3514.

Figures 35A, 35B:
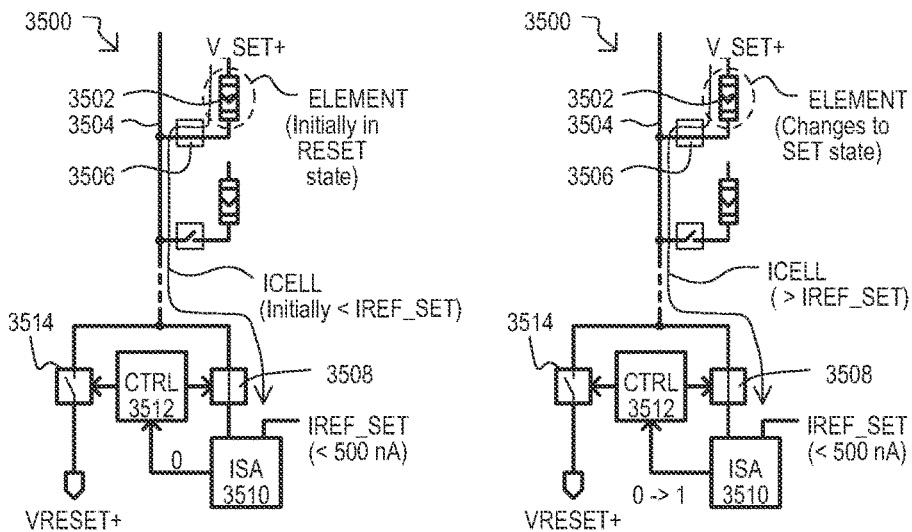
FIGS. 35A to 35D are block schematic diagram showing a memory device having low energy programming according to an embodiment.

FIG. 35A shows an initial part of a programming operation that programs element 3502 to a SET state. One terminal of element 3502 can be connected to a set voltage V_SET+. An opposing terminal of element 3502 can be connected to bit line 3504 by access device 3506. Select switches 3508 can connect bit line 3504 to current sense amplifier 3510. Select switch 3514 can isolate bit line 3504 from reset voltage VRESET+.

Referring still to FIG. 35A, current sense amplifier 3510 can create a relatively low bias potential across element 3502, generating a relatively small current ICELL through element 3502. Current sense amplifier 3510 can monitor current ICELL by comparing it to a program reference current IREF_SET. Program reference current IREF_SET can be a small current, and in one particular embodiment, can be less than 500 nA. Because a current ICELL is less than reference current IREF_SET, a current sense amplifier 3510 can output one value (in this case 0) to controller 3512.

FIG. 35B shows a second part of a programming operation that programs element 3502 to a SET state. As element 3502 starts to program to the SET state, a current flowing through element ICELL can be greater than the set reference current IREF_SET. As a result, an output from sense amplifier 3510 to controller 3512 can change (from 0 to 1 in this case). In response, controller 3512 can open select switch 3508 ending the low bias, low current program operation.

Figures 35C, 35D:
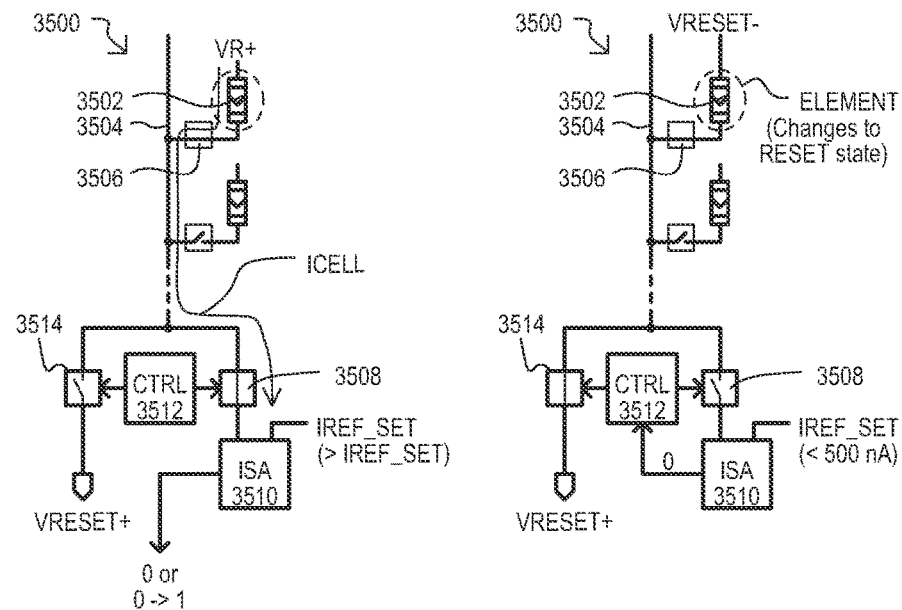

FIG. 35C shows a read operation of element 3502. One terminal of element 3502 can be connected to a read bias voltage VR+. An opposing terminal of element 3502 can be connected to bit line 3504 by access device 3506. Select switches 3508 can connect bit line 3504 to current sense amplifier 3510. Current sense amplifier 3510 can monitor a current through element (ICELL) by comparing it to a read reference current IREF_RD. Read reference current IREF_RD can rise to levels larger than IREF_SET.

Referring still to FIG. 35C, if element 3502 dynamically changes conductivity within a set time period, a current sense amplifier 3510 output can indicate such an event (switch from 0 to 1 in this example). If such a dynamic change does not occur, a current sense amplifier 3510 output can indicate so (maintain 0 in this example).

FIG. 35D shows a programming operation that programs element 3502 to a RESET state. One terminal of element 3502 can be connected to a reset voltage VRESET−. An opposing terminal of element 3502 can be connected to bit line 3504 by access device 3506. Select switches 3508 can be opened, while select switch 3514 can connect bit line 3504 to reset voltage VRESET+. In a particular embodiment, such bias conditions can be maintained for a set period time. That is, unlike the SET programming operation, which has a low compliance current, a RESET programming operation can be substantially voltage driven.

Figure 36:
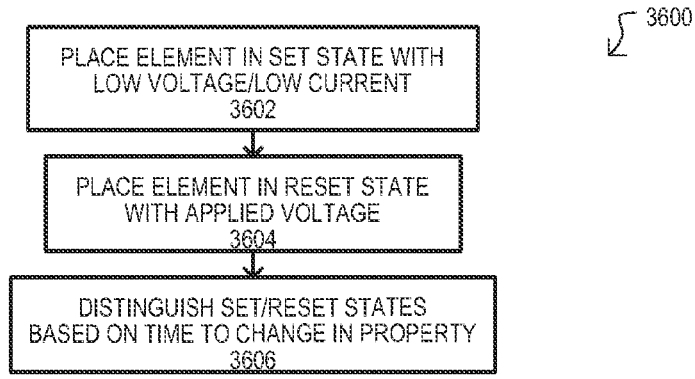
FIG. 36 is a flow diagram showing a low energy programming method according to an embodiment.

FIG. 36 shows a method 3600 for programming time-to-change elements according to a further embodiment. A method 3600 can include placing an element into a set state with a low voltage/low current 3602. Such an action can include applying voltage and current through an element that are both smaller than those utilized in a read operation.

Elements can be placed in a reset state with an applied voltage 3604. In some embodiments, such an action includes not monitoring a current flowing through such an element.

A method 3600 can distinguish between SET and RESET states based on a time to change in property of an element 3606. Such a step can include any suitable method disclosed herein, and equivalents.

Figure 37:
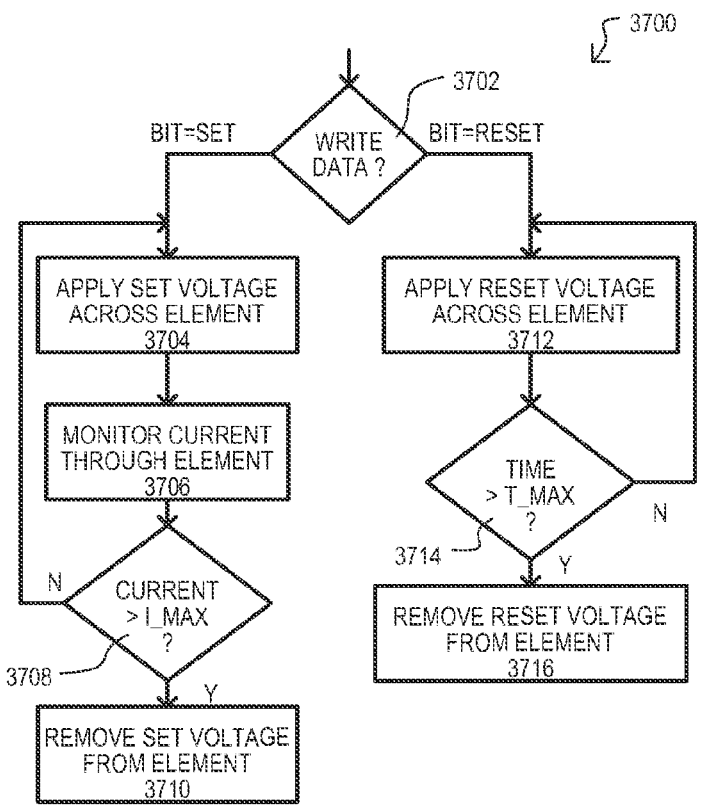
FIG. 37 is a flow diagram showing a low energy programming method according to another embodiment.

FIG. 37 is a flow diagram showing another programming method 3700 according to an embodiment.

A method 3700 can include determining a type of write data 3702. If write data indicates a SET bit (BIT=SET from 3702), a set voltage can be applied across an element (3704). A current flowing through an element can be monitored 3706. If a current limit is not reached (N from 3708), a method 3700 can continue to apply the set voltage and monitor a resulting current.

If a current flowing through an element reaches a limit (Y form 3708), a method can remove the set voltage from the element (3710). In some embodiments, a current limit can be a relatively small current. In particular embodiments, such a current can be less than 500 nA.

Referring still to FIG. 37, if write data indicates a RESET bit (BIT=RESET form 3702), a reset voltage can be applied across an element (3712). Such a reset voltage can be applied until a time limit is reached (Y from 3714). Once the time limit is reached, a reset voltage can be removed from an element 3716).

Figure 38A:
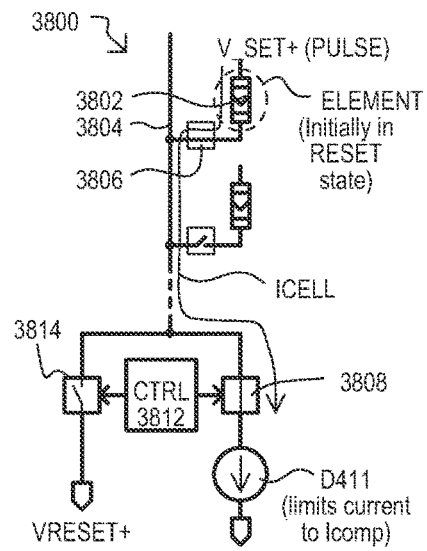
FIG. 38A is a block schematic diagram showing a memory device having low energy programming according to another embodiment.

FIG. 38A is a block schematic diagram showing a memory device 3800 according to another embodiment. A memory device 3800 can include items like those shown in FIG. 35A. However, unlike FIG. 35A, a memory device 3800 does not sense a current to stop programming operations. Instead, a programming current can be limited by a current limiter 3811.

In such an embodiment, a program (write) operation can apply a pulse of predetermined duration, but limited current. Such current limiting can ensure a programmed element is placed in a desired (e.g., SET) state.

Figure 38B:
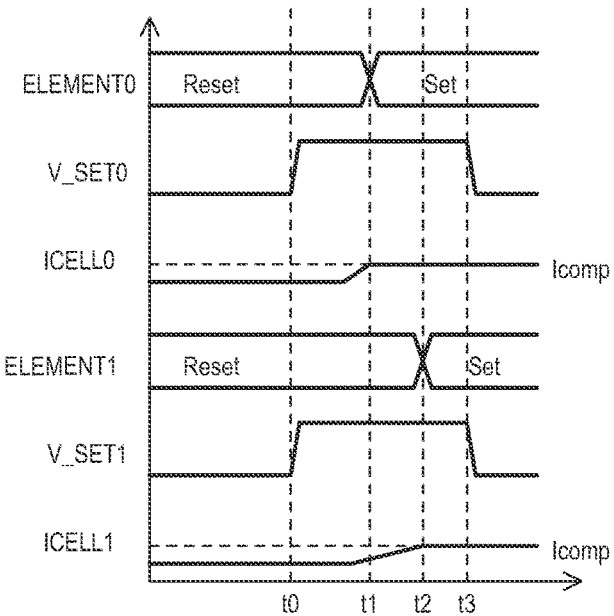
FIG. 38B is a timing diagram showing an operation of a memory device like that of FIG. 38A.

FIG. 38B is a timing diagram showing write operations to two memory elements (ELEMENT0 and ELEMENT1) according to an embodiment like that shown in FIG. 38A.

Prior to time t0, memory elements can have one state (in this example, both are in the RESET state).

At about time t0, write pulses of a same duration can be applied to the memory elements (shown by V_SET0 and VSET_1). However, such pulses have a low current compliance due to current limiting. As a result, a current flowing through an element during such a write operation is limited to a value Icomp.

At about time t1, ELEMENT0 can be placed into a SET state, as shown by a current ICELL0 reaching the low compliance level.

At about time t2, ELEMENT1, which is subject to a same write pulse as ELEMENT0, can be placed into the SET state, as shown by a current ICELL1. It is noted that in such an operation, a cell current is not monitored, but rather limited. This is in contrast to the embodiment shown in FIGS. 35B to 35D in which a sense amplifier can compare a current through a memory element to a reference current.

A memory device and method according to the embodiments may be included in a standalone memory device (i.e., a memory device providing substantially only storage functions). In alternate embodiments, such a memory device may be embedded into larger integrated circuit device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   a plurality of bit lines;
   plurality of memory elements coupled to the bit lines, each memory element including a memory layer formed between two electrodes, the memory layer being programmable between a plurality of different resistance states by creation and removal of conductive regions therein by application of electric fields;
   at least one sense amplifier (SA) configured to compare a first value, corresponding to a resistance state of a first memory element, to a second value, corresponding to a resistance state of a second memory element;
   bit line access devices configured to selectively connect bit lines to the at least one SA;
   charge circuits configured to charge selected bit lines to a predetermined voltage; and
   cell access devices configured to isolate the memory elements from the selected bit lines as the selected bit lines are being charged; wherein
   the cell access devices are further configured to connect one memory element to the selected bit lines after the selected bit lines have been charged.

2. The memory device of claim 1, wherein:
   the first memory element is coupled to a first bit line; and
   the second memory element is coupled to a second bit line.

3. The memory device of claim 1, wherein:
   the first and second values are voltages that are compared to one another by the at least one SA.

4. The memory device of claim 1, further including:
   bit line access devices configured to connect the selected bit lines to the at least one SA after the memory elements have been connected to the selected bit lines.

5. The memory device of claim 1, wherein:
   the at least one SA is configured to
      generate a first output value when the first memory element has a first resistance state and the second memory element has a second resistance state and
      generate a second output value when the first memory element has the second resistance state and the second memory element has the first resistance state.

6. A method, comprising:
   in an array of memory elements, where each memory element is programmable between a plurality of different resistance states by creation and removal of conductive regions in a memory layer by application of electric fields, programming first and second memory elements to different resistance states; and
   sensing a single data value by
      generating a first value corresponding to the resistance state of the first memory element,
      generating a second value corresponding to the resistance state of the second memory element, and
      comparing the first value to the second value; wherein
   sensing the single data value includes
      coupling the first memory element to a first bit line,
      coupling the second memory element to a second bit line,
      coupling the first and second bit lines to a sense amplifier, and
      programming the first and second memory elements includes programming the first and second memory elements to one resistance state and subsequently programming the second memory element to a resistance state different from the one resistance state.

7. The method of claim 6, wherein:
   programming the first and second memory elements includes one selected from the group of:
   programming the first memory element to a first resistance state and the second memory element to a second resistance state to store a first single data value, and
   programming the first memory element to the second resistance state and the second memory element to the first resistance state to store a second single data value.

8. The method of claim 6, wherein:
   sensing the single data value further includes charging the first and second bit lines to a predetermined value before coupling the first and second memory elements to the first and second bit lines.

9. The method of claim 6, wherein:
coupling the first memory element to the first bit line includes activating a first word line to enable a first cell access device, and
coupling the second memory element to the second bit line includes activating a second word line to enable a second cell access device.

10. The method of claim 6, wherein:
generating the first value corresponding to the resistance state of the first memory element includes generating a first voltage on a first bit line; and
generating the second value corresponding to the resistance state of the second memory element includes generating a second voltage on a second bit line.

11. A memory device, comprising:
a plurality of memory elements logically divided into pairs of memory elements, each pair representing one stored value, each memory element being programmable between a plurality of different resistance states by creation and removal of conductive regions in a memory layer by application of electric fields;
at least one sense amplifier (SA) configured to compare a first value, corresponding to a resistance state of a first element of a selected pair, to a second value, corresponding to a resistance state of a second element of the selected pair;
one memory element of a selected pair is coupled to a first bit line, while the other memory element of the selected pair is coupled to a second bit line;
bit line access devices configured to couple the first and second bit lines to the at least one SA; and
charge circuits configured to charge at least the first and second bit lines to a predetermined voltage prior to the first and second memory elements being coupled to the first and second bit lines.

12. The memory device of claim 11, wherein:
the first value is a first voltage and the second value is a second voltage.

13. The memory device of claim 11, further including:
a plurality of cell access devices, one cell access device corresponding to each memory element, each cell access device configured to couple its corresponding memory element to a bit line.

14. The memory device of claim 11, further including:
the at least one SA configured to
generate a first output value when the resistance state of the first memory element differs from that of the second memory element in a first way, and
generate a second output value when the resistance state of the first memory element differs from that of the second memory element in a second way.

* * * * *